(12) United States Patent
Kato et al.

(10) Patent No.: US 7,335,910 B2
(45) Date of Patent: Feb. 26, 2008

(54) THIN FILM TRANSISTOR, SEMICONDUCTOR DEVICE, DISPLAY, CRYSTALLIZATION METHOD, AND METHOD OF MANUFACTURING THIN FILM TRANSISTOR

(75) Inventors: Tomoya Kato, Yokohama (JP); Masakiyo Matsumura, Kamakura (JP); Yoshiaki Nakazaki, Saitama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 0 days.

(21) Appl. No.: 11/432,387

(22) Filed: May 12, 2006

(65) Prior Publication Data

US 2007/0063228 A1    Mar. 22, 2007

(30) Foreign Application Priority Data

Sep. 8, 2005    (JP) .............................. 2005-260490

(51) Int. Cl.
```
H01L 29/04      (2006.01)
H01L 29/10      (2006.01)
H01L 31/036     (2006.01)
H01L 31/0376    (2006.01)
H01L 29/00      (2006.01)
```
(52) U.S. Cl. ............................ 257/57; 257/59; 257/75; 257/521; 257/527; 257/627; 257/628
(58) Field of Classification Search ........ 257/627–628, 257/57, 59, 75, 521, 527
See application file for complete search history.

(56) References Cited

U.S. PATENT DOCUMENTS 6,608,326 B1 *   8/2003   Shinagawa et al. ........... 257/64

(Continued)

OTHER PUBLICATIONS

T. Katou, et al., "28a-ZG-6 Effects of Layer Thickness on Microstructure of Phase-Modulated ELA Si Thin-Films", Extended Abstracts (The 51st Spring Meeting, 2004); The Japan Society of Applied Physics and Related Societies, No. 2, 2004, 7 pages.

(Continued)

Primary Examiner—Ida M. Soward
(74) Attorney, Agent, or Firm—Oblon, Spivak, McClelland, Maier & Neustadt, P.C.

(57) ABSTRACT

An object of the present invention is to provide a thin film transistor having a high mobility and having fewer fluctuations in the mobility or threshold voltage characteristics. A non-single-crystal semiconductor thin film having a thickness of less than 50 nm and disposed on an insulating substrate is irradiated with laser light having an inverse-peak-patterned light intensity distribution to grow crystals unidirectionally in a lateral direction. Thus, band-like crystal grains having a dimension in a crystal growth direction, which is longer than a width, are arranged adjacent to each other in a width direction to form a crystal grain array. A source region and a drain region of a TFT are formed so that a current flows in the crystal growth direction in an area including a plurality of crystal grains of this crystal grain array.

6 Claims, 13 Drawing Sheets

U.S. PATENT DOCUMENTS

| | | | | |
|---|---|---|---|---|
| 6,667,198 | B2* | 12/2003 | Shimoto et al. | 438/166 |
| 6,876,001 | B2* | 4/2005 | Koo et al. | 257/72 |
| 6,903,368 | B2* | 6/2005 | Yamaguchi et al. | 257/57 |
| 6,927,419 | B2* | 8/2005 | Hara et al. | 257/64 |
| 6,969,871 | B2* | 11/2005 | Yamaguchi et al. | 257/66 |
| 6,979,605 | B2* | 12/2005 | Yamazaki et al. | 438/166 |
| 7,071,082 | B2* | 7/2006 | Jung | 438/486 |
| 7,172,932 | B2* | 2/2007 | Hatano et al. | 438/166 |
| 2003/0057418 | A1* | 3/2003 | Asano | 257/66 |
| 2003/0211666 | A1* | 11/2003 | Okumara | 438/151 |
| 2004/0085268 | A1* | 5/2004 | Kim et al. | 345/76 |
| 2005/0233511 | A1* | 10/2005 | You | 438/166 |

OTHER PUBLICATIONS

Masakiyo Matsumura, "Preparation of Ultra-Large Grain Silicon Thin-Films by Excimer-Laser", Surface Science, Vol. 21, No. 5, 2000, pp. 278-287, with English Abstract.

T. Katou et al., "Effects of Layer Thickness on the Microstructure of Phase-Modulated Excimer-Laser-Annealed Silicon Thin Films", AM-LCD '04, 2004, pp. 149-152.

M. Hiramatsu, "Advanced Laser Crystallization Technologies of Si for Next-Generation TFTs", IDW '04 The 11th International Display Workshops, Dec. 8-10, 2004, pp. 1-10 with cover page.

* cited by examiner

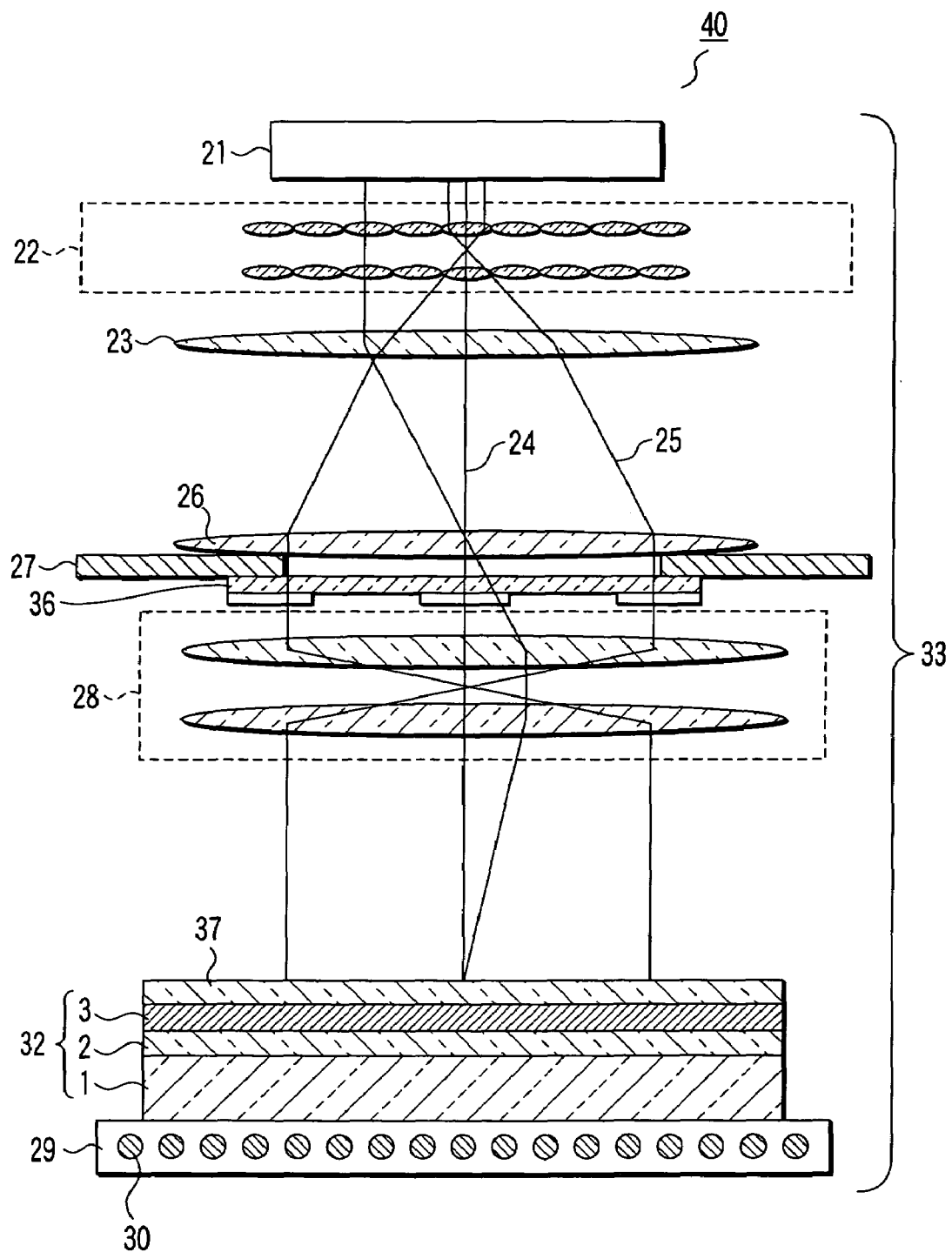
F I G. 9

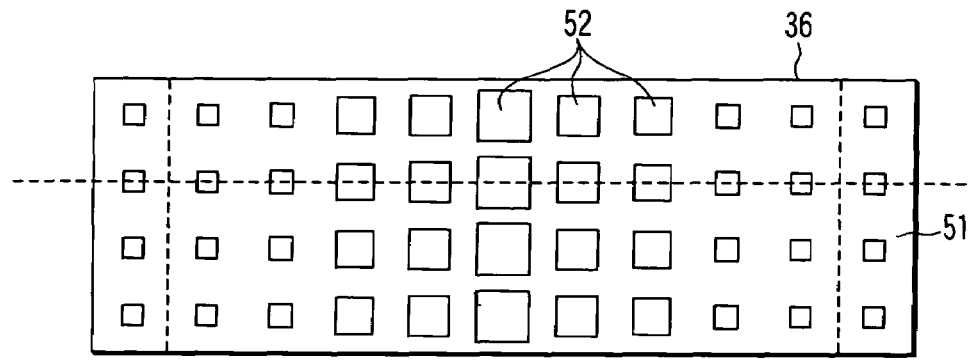
F I G. 10A
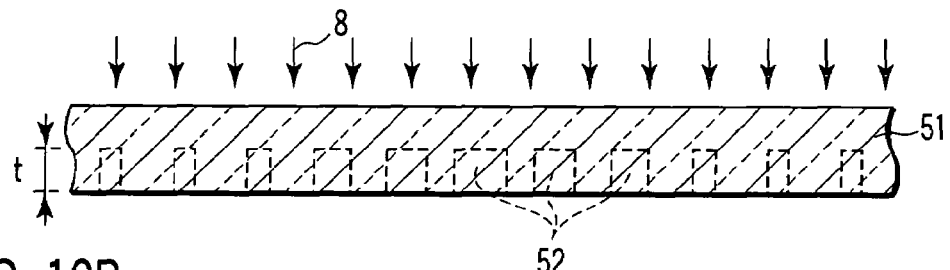
F I G. 10B
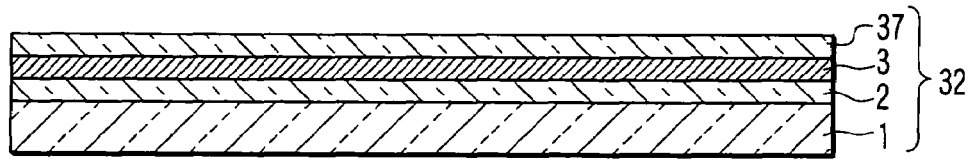
F I G. 10C
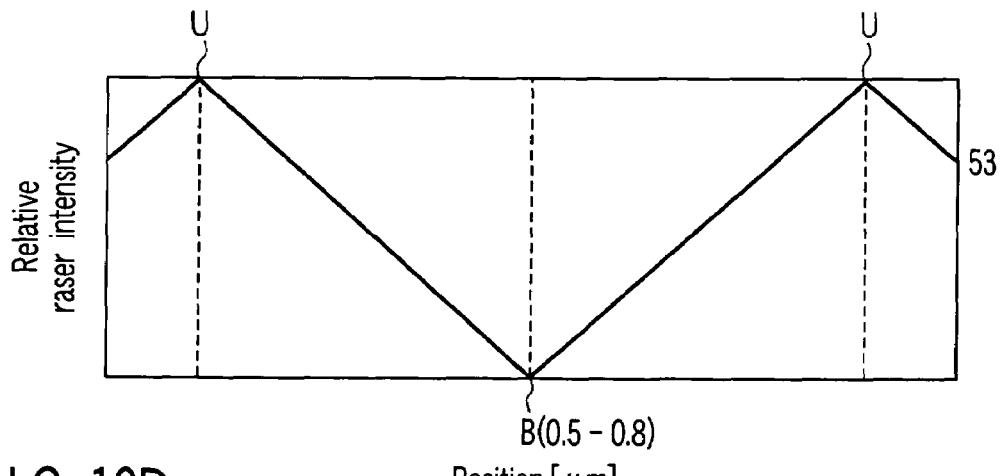
F I G. 10D

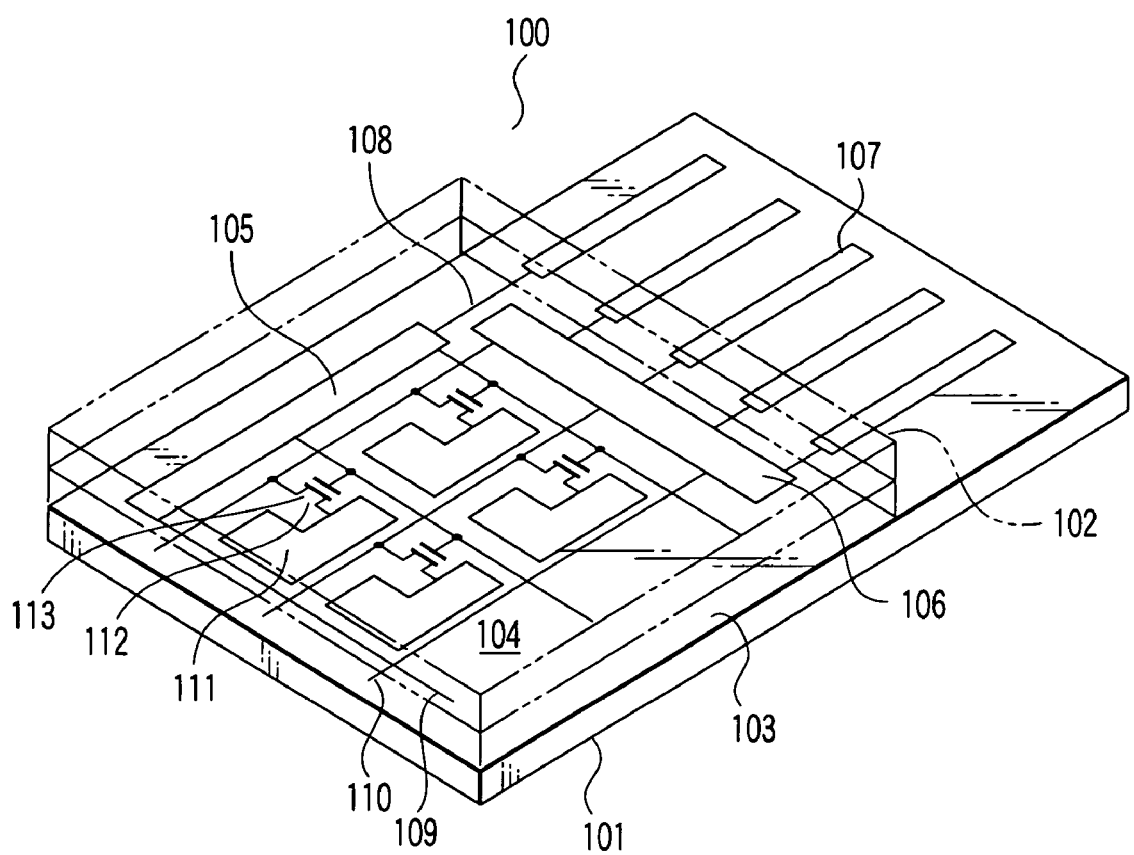
F I G. 15

THIN FILM TRANSISTOR, SEMICONDUCTOR DEVICE, DISPLAY, CRYSTALLIZATION METHOD, AND METHOD OF MANUFACTURING THIN FILM TRANSISTOR

CROSS-REFERENCE TO RELATED APPLICATIONS

This application is based upon and claims the benefit of priority from prior Japanese Patent Application No. 2005-260490, filed Sep. 8, 2005, the entire contents of which are incorporated herein by reference.

BACKGROUND OF THE INVENTION

1. Field of the Invention

The present invention relates to a thin film transistor, a semiconductor device, a display, a crystallization method, and a method of manufacturing the thin film transistor.

2. Description of the Related Art

Since a thin film transistor (hereinafter referred to as a TFT) has characteristics wherein the transistor can be formed on the surface of anything, it is possible to directly form a circuit for display on, for example, a display panel surface of a display. In the TFT of an initial stage of development, a channel region has been formed in an amorphous silicon layer deposited on a substrate. In the existing TFT, the channel region is formed in a polycrystalline silicon film formed by crystallizing the amorphous silicon layer. Accordingly, carrier mobility is about accelerated tenfold.

The polycrystalline silicon film has a structure in which micro single crystals having a grain size of about 0.1 μm are irregularly scattered. In the TFT in which the channel region is formed in this polycrystalline silicon film, a large number of crystal grain boundaries exist in the channel region owing to micro single crystals. The crystal grain boundaries indicate resistances to electrons or holes which move in the channel region. Since the number of the crystal grain boundaries differs betweens the adjacent TFTs, fluctuations are generated in characteristics of the TFTs. The TFT formed in the polycrystalline silicon film in this manner has a problem that the fluctuations are generated in the characteristics between the TFTs.

The present inventors have proposed a crystallization method for forming large-sized crystal grains, in which one or a plurality of TFTs can be formed in one single crystal grain for a purpose of obtaining a transistor having characteristics equal to those of a transistor formed on a silicon wafer (Surface Science Vol. 21, No. 5, P278 to 287 [2000]), and they have proceeded with development of a technology for industrializing the method. Since the TFT is formed in the single crystal grain, transistor characteristics are not adversely affected by the crystal grain boundary, and TFT characteristics are largely improved unlike a conventional TFT in which the crystal grain boundaries exist in the channel region.

Heretofore, a driving circuit of a display such as a liquid crystal display has been formed in an amorphous semiconductor film or a polycrystalline semiconductor film deposited on a glass substrate which is a display panel. With enlargement of an IT market, handled information is digitized, processing is accelerated, and a high image quality is also demanded in the display. To satisfy this demand, it is preferable to form, for example, the TFT which drives each pixel in a crystalline semiconductor. This increases a switching speed, and the high image quality is possible.

Furthermore, in addition to the pixel switching circuit, the display includes: a digital-to-analog converter which converts digital video data into an analog video signal; a signal processing circuit such as a gate array which processes the digital video data; a driving circuit such as a signal line driving circuit or a scanning line driving circuit and the like. There is a demand that these circuits be integrated on the same display panel substrate as that of the pixel switching circuit. To satisfy such demand, a TFT having a higher carrier mobility needs to be developed.

BRIEF SUMMARY OF THE INVENTION

The present invention has been developed to solve the above-described problem, and an object of the present invention is to provide a thin film transistor having a high mobility and having fewer fluctuations in the mobility and threshold voltage characteristics. Another object of the present invention is to provide a semiconductor device having the above-described characteristics, a display including the thin film transistor as a constituting element, a crystallization method for realizing the characteristics, and a method of manufacturing the thin film transistor.

In the present invention, a thin film transistor comprises:
a substrate;
a non-single-crystal semiconductor thin film (e.g., an amorphous silicon or polysilicon thin film) disposed directly or indirectly on the substrate;
a crystal grain array formed in the non-single-crystal semiconductor thin film and constituted of band-like crystal grains extending in a longitudinal direction and arranged adjacent to each other in a width direction; and
a source region and a drain region including a plurality of crystal grains of the crystal grain array and formed so that a current flows in the longitudinal direction of the crystal grains,
wherein the crystal grains are formed by generating crystal species in the non-single-crystal semiconductor thin film, and then growing crystals from the respective crystal species in the longitudinal direction.

Preferably, a crystal growth direction of the crystal grains is preferentially oriented in <110>.

In the thin film transistor, an orientation of a face of a channel region disposed between the source region and the drain region and facing a gate insulating film is preferably in a range of {001} to {112}.

Preferably, the crystal grains have a length in a range of 4 to 15 μm, and a width in a range of 0.2 to 0.6 μm.

Preferably, the non-single-crystal semiconductor thin film has a thickness of less than 50 nm.

Preferably, the width direction crossing the crystal growth direction at right angles is preferentially oriented in a direction rotating in a range of <110> to <111> around the crystal growth direction as an axis.

A semiconductor device of the present invention comprises:
a substrate;
a non-single-crystal semiconductor thin film disposed directly or indirectly on the substrate; and
a crystal grain array formed in the non-single-crystal semiconductor thin film and constituted of band-like crystal grains extending in a longitudinal direction and arranged adjacent to each other in a width direction,
wherein the crystal grains are formed by generating crystal species in the non-single-crystal semiconductor thin film, and then growing crystals from the respective crystal species in the longitudinal direction, and a crystal growth direction of the crystal grains is preferentially oriented in <110>.

In the semiconductor device, preferably the crystal grains have a length in a range of 4 to 15 μm, and a width in a range of 0.2 to 0.6 μm.

Preferably, the non-single-crystal semiconductor thin film has a thickness below 50 nm.

Preferably, the width direction crossing the crystal growth direction at right angles is preferentially oriented in a direction rotating in a range of <110> to <111> around the crystal growth direction as an axis.

A semiconductor device of the present invention comprises:

a substrate;

a non-single-crystal semiconductor thin film disposed directly or indirectly on the substrate; and a crystal grain array formed in the non-single-crystal semiconductor thin film and constituted of band-like crystal grains extending in a longitudinal direction and arranged adjacent to each other in a width direction, wherein the crystal grains are formed by generating crystal species in the non-single-crystal semiconductor thin film, and then growing crystals from the respective crystal species in the longitudinal direction, and a normal direction to a film plane of the crystal grains is preferentially oriented in a direction rotating in a range of {100} to {112} around a crystal growth direction as an axis.

A display of the present invention comprises:

a substrate;

a non-single-crystal semiconductor thin film disposed directly or indirectly on the substrate;

a crystal grain array formed in the non-single-crystal semiconductor thin film and constituted of band-like crystal grains extending in a longitudinal direction and arranged adjacent to each other in a width direction, the crystal grains being formed by generating crystal species in the non-single-crystal semiconductor thin film, and then growing crystals from the respective crystal species in the longitudinal direction;

a thin film transistor having a source region and a drain region including a plurality of crystal grains of the crystal grain array and formed so that a current flows in the longitudinal direction; and a pixel switching circuit constituted of the thin film transistors.

A crystallization method of the present invention comprises:

forming a non-single-crystal semiconductor thin film directly or indirectly on a substrate;

forming a photo-absorptive insulating film which absorbs a part of laser light on the non-single-crystal semiconductor thin film; and irradiating the insulating film with the laser light having a light intensity distribution in which a plurality of inverse peak patterns continue on the surface of the insulating film to form, in the non-single-crystal semiconductor thin film, a crystal grain array constituted of band-shaped crystal grains extending in a longitudinal direction and disposed adjacent to each other in a width direction, the crystal grains being crystallized so that the longitudinal direction is preferentially oriented in {110}.

In the crystallization method, preferably, assuming that a light intensity of a maximum intensity portion is one, a light intensity of a minimum intensity portion is preferably in a range of 0.5 to 0.8 in the inverse-peak-patterned light intensity distribution.

In the present invention, a method of manufacturing a thin film transistor, comprises:

forming a non-single-crystal semiconductor thin film directly or indirectly on a substrate;

forming a photo-absorptive insulating film which absorbs a part of laser light on the non-single-crystal semiconductor thin film;

irradiating the insulating film with the laser light having a light intensity distribution in which a plurality of inverse peak patterns continue on the surface of the insulating film to form, in the non-single-crystal semiconductor thin film, a crystal grain array constituted of band-shaped crystal grains extending in a longitudinal direction and arranged adjacent to each other in a width direction, the crystal grains being crystallized so that the longitudinal direction is preferentially oriented in {110};

forming a source region and a drain region so that a current flows in the longitudinal direction in an area including a plurality of crystal grains of the crystal grain array.

According to the present invention, it is possible to obtain a TFT having a high mobility and having fewer fluctuations in the mobility or threshold voltage characteristics.

BRIEF DESCRIPTION OF THE SEVERAL VIEWS OF THE DRAWING

FIG. 9 is a constitution diagram of a crystallization apparatus for forming a crystal grain array shown in FIG. 2;

FIGS. 10A to 10D are explanatory views showing a constitution of a phase shifter, a light intensity distribution of transmission light, and a constitution of a substrate to be processed in the crystallization apparatus shown in FIG. 9;

FIG. 15 is a perspective view showing an embodiment of a display in the present invention;

DETAILED DESCRIPTION OF THE INVENTION

Figure 1:
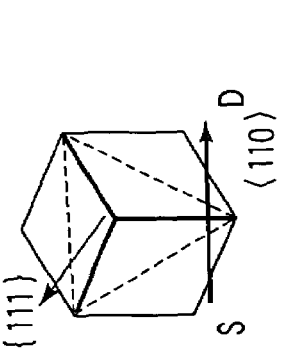
FIG. 1 is a diagram showing a relation between a crystal face of a crystallized area where a channel region is formed and mobility of a TFT in the TFT of the present invention.

Preferable embodiments of the present invention will be described with reference to the accompanying drawings. In the respective drawings, the same components are denoted with the same reference numerals, and redundant description is omitted.

It has been found that there is a relation shown in FIG. 1 between mobility of a TFT in a channel region and an oriented surface of a crystal in which the channel region is formed. In FIG. 1, a source region of the TFT is denoted with S, a drain region is denoted with D, and a direction of a current between S and D is shown by an arrow.

When an amorphous silicon layer on a substrate is irradiated with laser light, and a crystal is unidirectionally grown in a lateral direction (i.e., a direction parallel to the substrate surface), a crystallized area is formed on the substrate. Characteristics shown in an upper part of FIG. 1 are mobility characteristic of a TFT formed in the crystallized area whose crystal growth direction is <110>. When a crystal orientation of the surface of the channel region brought into contact with a gate insulating film of the TFT is in a range of {001} to {112}, mobility μEF is highest and in a range of 685 to 500 cm²/Vs. When the crystal orientation of the surface of the channel region is {110}, the mobility μEF is in a range of 450 to 300 cm²/Vs. When the crystal orientation of the surface of the channel region is {111}, the mobility μEF is in a range of 300 to 230 cm²/Vs.

Characteristics shown in a lower part of FIG. 1 are mobility characteristics at a time when a TFT is formed in a crystallized area whose crystal growth direction is <100>. When the crystal orientation of the surface of the channel region is {001}, the mobility μEF is 500 cm²/Vs. When the crystal orientation of the surface of the channel region is {010}, the mobility μEF is 346 cm²/Vs.

It is seen from the above data that the TFT having the best mobility μEF is manufactured at a time when the crystal orientation of the surface of the channel region is {001} to {112}.

The above TFT is manufactured by the following steps of: forming a non-single-crystal semiconductor thin film directly or indirectly on a substrate; irradiating the non-single-crystal semiconductor thin film with laser light to generate crystal species; and then growing crystals from the respective crystal species unidirectionally in a lateral direction (i.e., direction parallel to the substrate surface), thereby obtaining a crystal grain array constituted of band-shaped crystal grains extending in a longitudinal direction (i.e., crystal growth direction) and disposed adjacent to each other in a width direction; and forming a source region and a drain region in an area including a plurality of crystal grains of the crystal grain array so that a current flows in the longitudinal direction of crystal grains.

Figure 2:
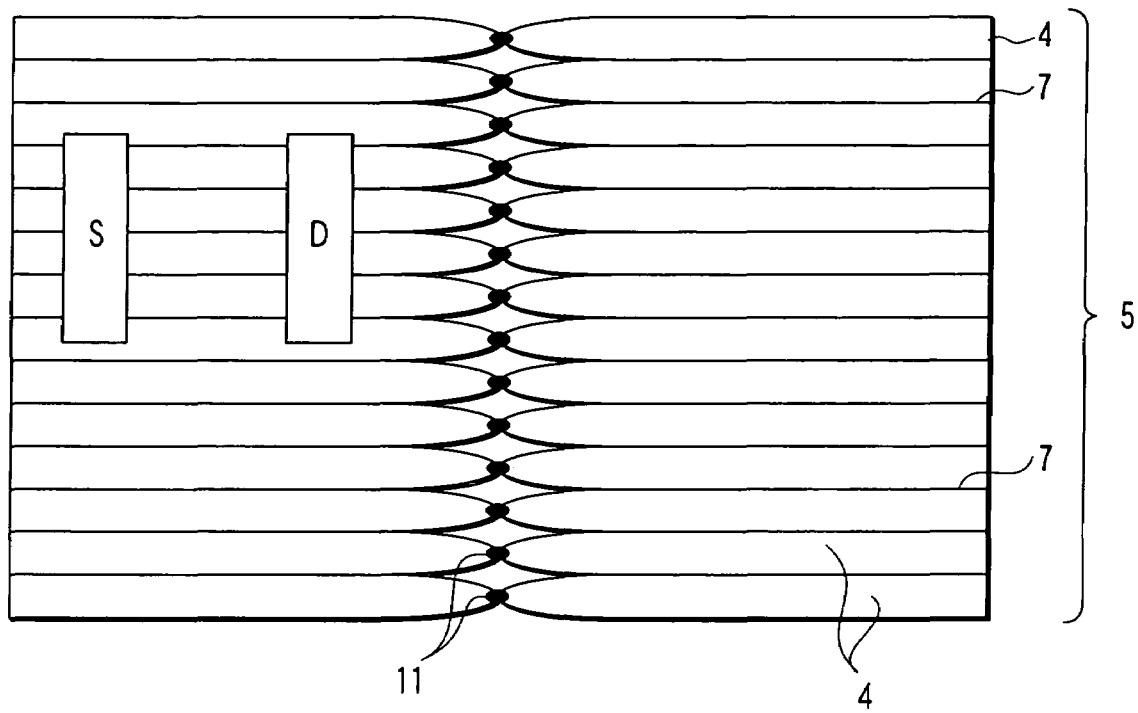
FIG. 2 is a plan view showing a crystal grain array formed by a crystallization method of the present invention.
Figure 3:
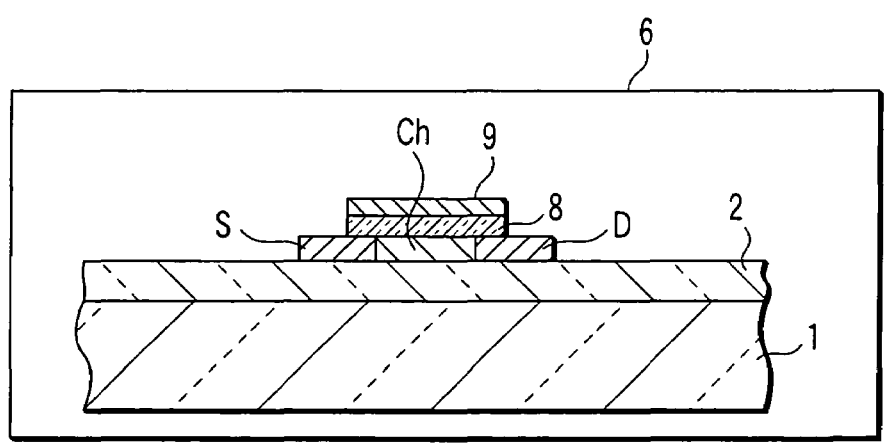
FIG. 3 is a sectional view showing a constitution of the TFT in which the channel region is constituted of the crystal grain array of FIG. 2.

The TFT will be described in more detail with reference to FIGS. 2 and 3. FIG. 2 is a plan view showing an enlarged crystal grain array formed by crystallizing an amorphous silicon layer. FIG. 3 is a sectional view showing a constitution of the TFT in which the channel region is constituted of the crystal grain array of FIG. 2. A substrate insulating film, for example, an SiO₂ layer 2 is formed on a substrate 1 (e.g., a glass substrate). A non-single-crystal semiconductor film, for example, the amorphous silicon layer is formed on this SiO₂ layer 2. The amorphous silicon layer is deposited in a thickness of 50 nm or less, for example, a thickness of 30 nm.

As shown in FIG. 2, a crystal grain array 5 is formed from the thin amorphous silicon layer by a PMELA process. In the crystal grain array, elongated crystal grains 4 are disposed adjacent to each other in a width direction. Each crystal grain 4 has a band-like shape which is long in a crystal growth direction rather than the width direction, and the crystal grain has a length of 4 to 15 μm, and a width of 0.2 to 0.6 μm. The growth direction of the crystal grain 4 is preferentially oriented in <110>.

In the crystal grain array 5, the crystal grains 4 are arranged in the width direction. A TFT 6 is formed using this crystal grain array 5. This TFT 6 is provided with a source region S and a drain region D so that electrons and holes move along crystal grain boundaries 7. In other words, the source region S and the drain region D are formed so that a current (hole movement direction) flows in the crystal growth direction.

As shown in FIG. 2, a channel region C formed between the source region S and the drain region D is formed involving a plurality of, for example, four or five adjacent crystal grains 4. In the channel region, the width of the crystal grain 4 is substantially constant regardless of the position of the grain in a longitudinal direction. A gate insulating film 8, for example, a laminate film of a surface oxide film and an SiO₂ film of the channel region C is disposed on the channel region C between the source region S and the drain region D.

Conditions to obtain satisfactory mobility characteristics are that an orientation of the face of the channel region C facing the gate insulating film 8 is in a range of {001} to {112}. A gate electrode 9 is disposed on the gate insulating film 8. The TFT 6 is constituted in this manner. In FIG. 2, reference numeral 11 denotes crystal growth start points.

Figure 4:
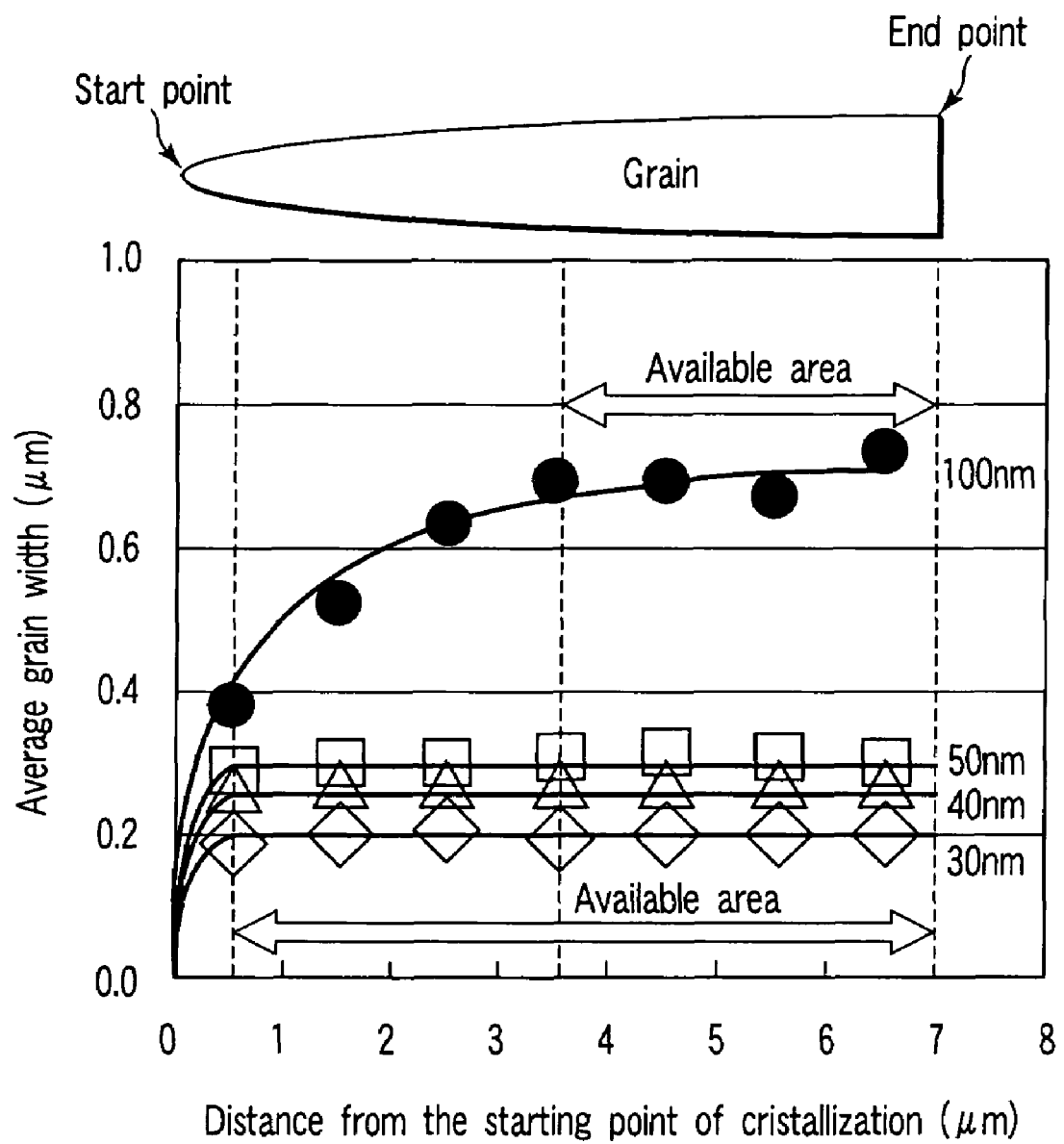
FIG. 4 is a diagram showing a relation between positions of crystal grains in a longitudinal direction and widths of the crystal grains at a time when a thickness of an amorphous silicon layer is changed.
Figure 5:
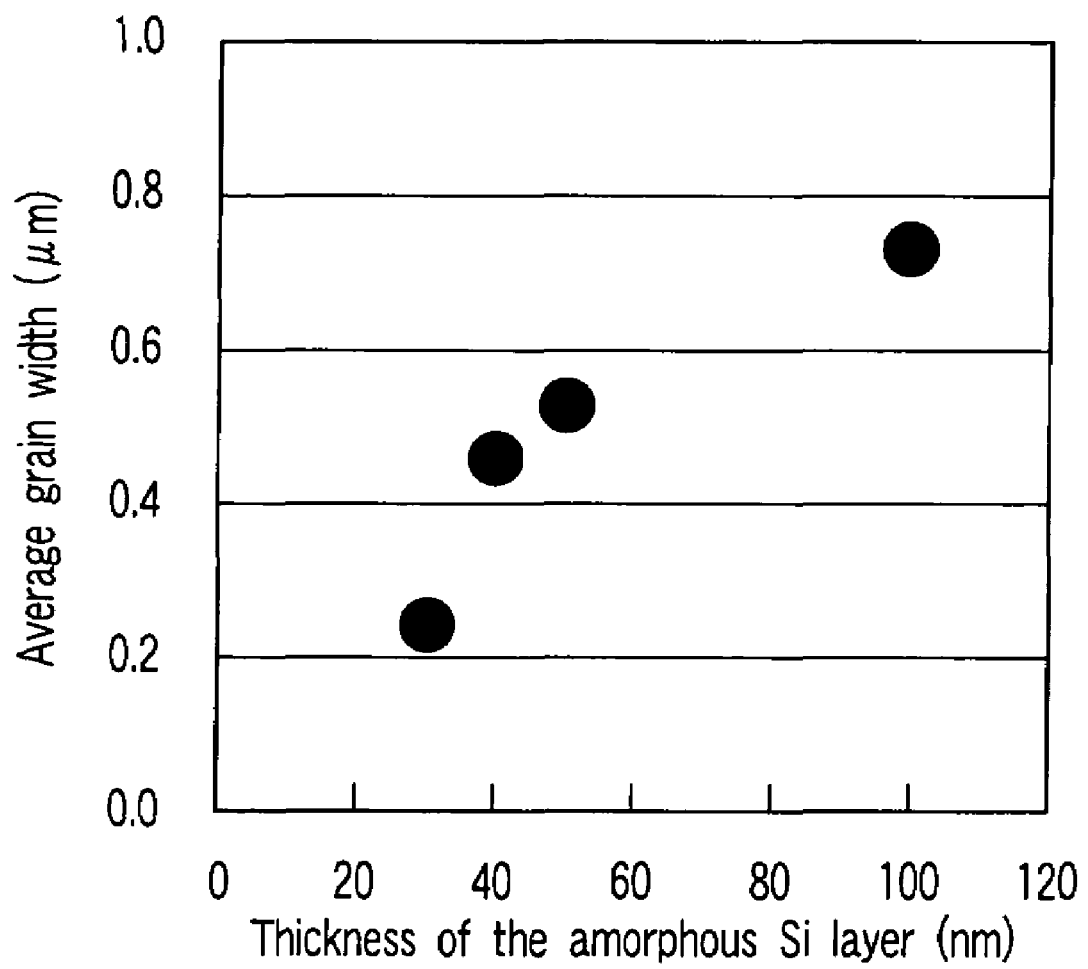
FIG. 5 is a diagram showing a relation between the thickness of the film and the widths of the crystal grains at the time when the thickness of the amorphous silicon layer is changed.

Next, the crystal grain array 5 shown in FIG. 2 will be described in detail. A relation between a distance of the crystal grain 4 from the crystal growth start point 11 and the width of the crystal grain 4 is shown in FIGS. 4 and 5. FIG. 4 shows a relation between the distance from the crystal growth start point 11 and the average width with respect to amorphous silicon (100 to 30 nm) having each thickness. FIG. 5 shows another example of a relation between the thickness of the amorphous silicon layer and the average width in a crystal growth end point.

FIGS. 4 and 5 show that when the thickness of the amorphous silicon layer decreases, a position where the growth of the width direction is saturated comes close to the crystal growth start point 11, an area where the channel region of the TFT 6 enlarges, and an average width decreases. In other words, when the area indicating the saturated state of the growth in the width direction is broad, it is meant that it is possible to form the TFT 6 which does not have any fluctuation in mobility or threshold voltage characteristics in a larger crystallization area.

When the TFT 6 (FIG. 3) is formed in the area indicating the saturated characteristics of the growth in the width direction, electrons or holes moving in the channel region C move parallel to the crystal grain boundaries 7. When the electrons or the holes move in parallel with the crystal grain boundaries 7, the mobility of the TFT is raised. Furthermore, the fluctuations in mobility characteristics (μFE) or threshold voltage characteristics (Vth) are reduced.

To utilize the crystallization area effectively, a thinner amorphous silicon layer needs to be formed. The decrease of the width results in increase of the number of the crystal grains disposed adjacent to one another required for forming one TFT 6. Similarly, the increase of the crystal grains can reduce the fluctuations in the mobility characteristics (μFE) and the threshold voltage characteristics (Vth). For example, in a case where the amorphous silicon layer has a thickness of 100 μm, a position where the growth in the width direction starts to be saturated is 3.5 μm from the crystal growth start point 11 (FIG. 2).

On the other hand, in a case where the amorphous silicon layer has a thickness of 50 μm, the position where the growth in the width direction starts to be saturated is 0.5 μm from the crystal growth start point 11. In a case where the amorphous silicon layer has a thickness of 30 μm, the position where the growth in the width direction starts to be saturated is 0.5 μm from the crystal growth start point 11. When the thickness of the amorphous silicon layer is smaller than 50 μm in this manner, it is possible to manufacture the TFT 6 having fewer fluctuations in the mobility characteristics (μFE) or the threshold voltage characteristics (Vth) in a large crystallization area. When the length of the crystal grain 4 is 4 to 15 μm, it is possible to manufacture the TFT 6 having fewer fluctuations in the mobility characteristics (μFE) or the threshold voltage characteristics (Vth) in a range of the width of 0.2 to 0.6 μm.

Figure 6:
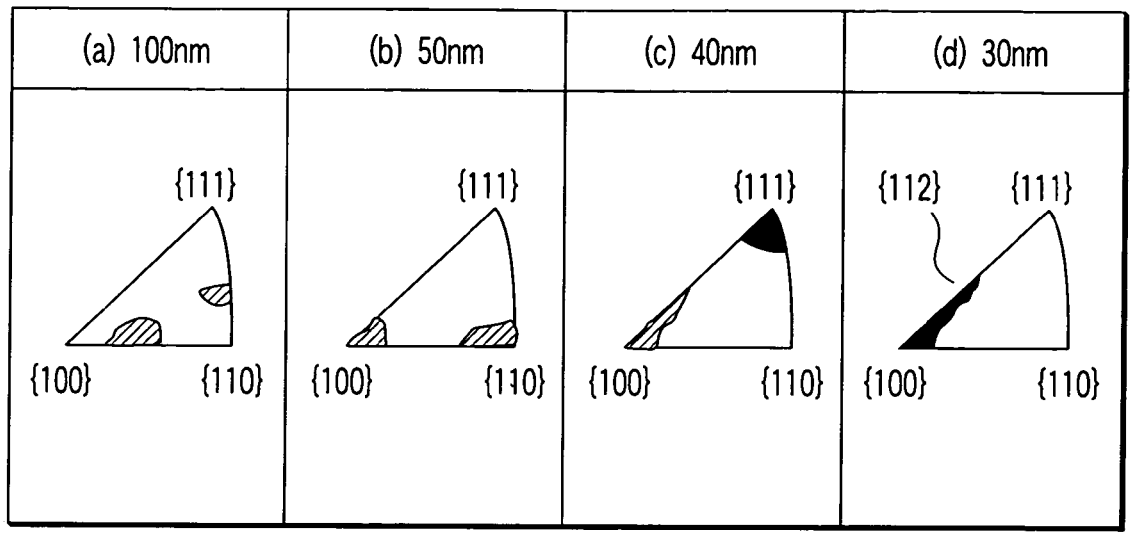
FIG. 6 is a diagram showing a relation between the thickness of the film and a crystal orientation in a direction of the normal to the film surface at the time when the thickness of the amorphous silicon layer is changed.
Figure 7:
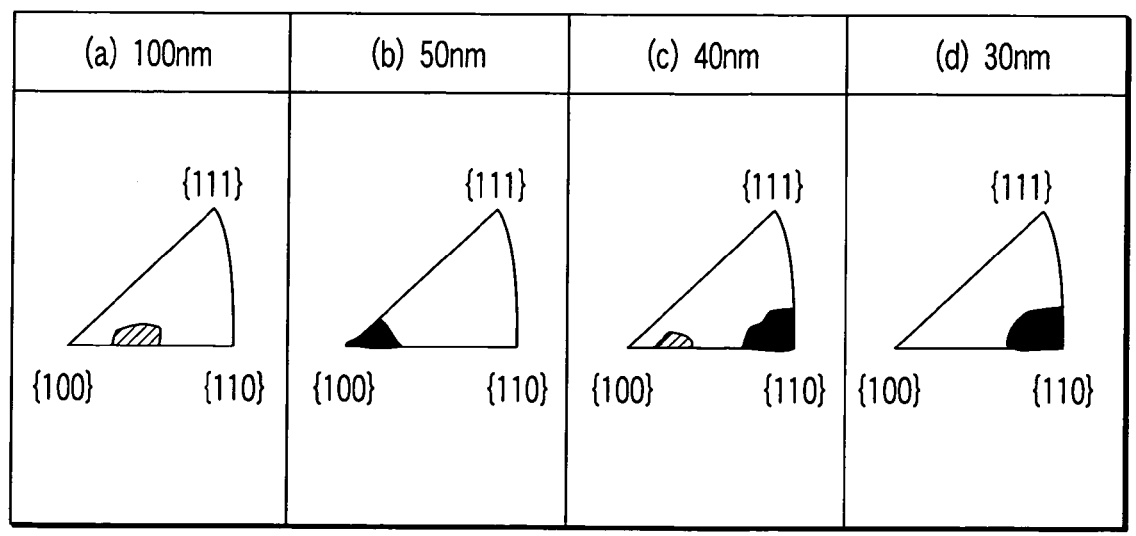
FIG. 7 is a diagram showing a relation between the thickness of the film and the crystal orientation in the crystal growth direction at the time when the thickness of the amorphous silicon layer is changed.
Figure 8:
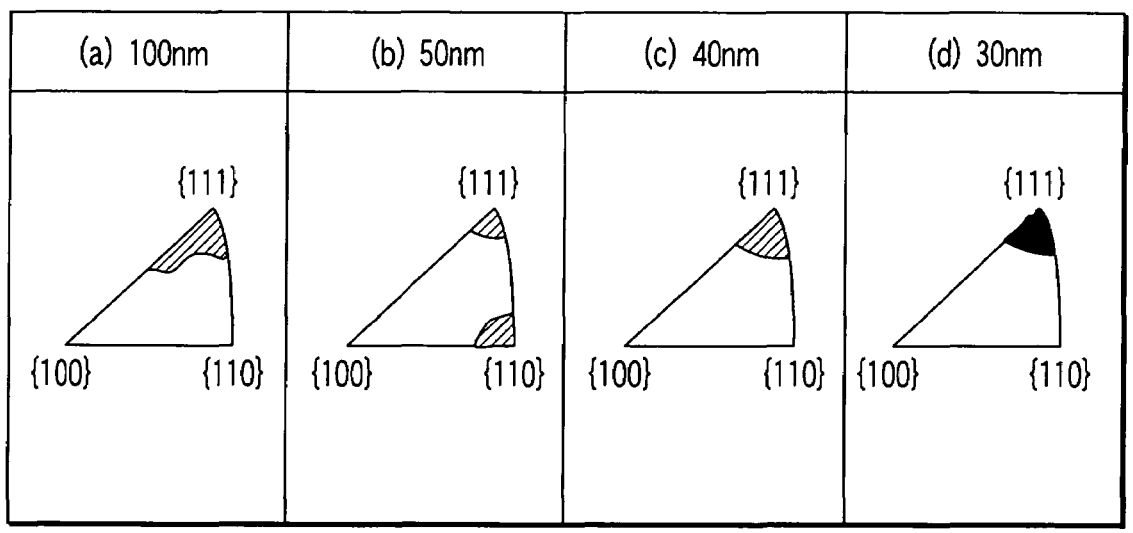
FIG. 8 is a diagram showing a relation between the thickness of the film and the crystal orientation in a width direction of the crystal grains at the time when the thickness of the amorphous silicon layer is changed.

FIGS. 6, 7, and 8 show relations between the thickness of the amorphous silicon layer and the crystal orientation. These drawings show the crystal orientation of the normal direction to the film plane, the crystal orientation of the crystal growth direction, and the crystal orientation of the width direction in association with the thickness of the amorphous silicon layer. These drawings show results of analysis of a structure of each amorphous silicon layer having each thickness by an electron back scattering pattern (EBSP). Each drawing shows a reverse polarity point chart showing configuration and orientation of the structure in a map form.

It is seen from FIG. 7 that the orientation of the longitudinal direction, that is, the crystal growth direction is preferentially oriented in <110> in a case where the thickness of the amorphous silicon layer is smaller than 50 nm. Furthermore, the normal direction to the film plane of the crystal grain is preferentially oriented in a direction rotating in a range of {100} to {112} around the crystal growth direction as an axis. For example, in a case where the crystal growth direction is preferentially oriented in <110>, and the normal direction is oriented in a range of {100} to {112}, when the TFT is formed in this crystallization area, it is possible to manufacture a TFT having a large mobility and fewer fluctuations in TFT characteristics.

The width direction crossing the crystal growth direction at right angles is preferentially oriented in a direction rotating in a range of <110> to <111> around the crystal growth direction as the axis. These data indicate that the thickness of an amorphous silicon layer 3 can be selected to thereby control the crystal orientation.

As seen from FIGS. 4 and 5, as the thickness of the amorphous silicon layer 3 decreases, the average width decreases, and an array of the elongated crystal grain 4 is constituted as shown in FIG. 2. For example, in a case where the thickness of the amorphous silicon layer 3 is 30 to 50 nm, the crystal grain 4 has a length of 8 μm. In a case where the thickness of the amorphous silicon layer 3 is 100 nm, a periodic V-shaped light intensity distribution just after the irradiation is not easily maintained owing to thermal diffusion in a film plane direction. Since the distribution collapses with an elapse of time, the length of the crystal grain 4 decreases. Here, the periodic V-shaped light intensity distribution is a light intensity distribution of an energy line by the PMELA process described later in order to form a large-particle-diameter crystallization area in a non-single-crystal semiconductor film.

Moreover, it is seen from FIGS. 6, 7, and 8 that as the thickness of the amorphous silicon layer 3 decreases, the orientation starts to appear. When the thickness is 30 nm, the longitudinal direction, that is, the crystal growth direction is preferentially oriented in <110>, the width direction crossing the crystal growth direction at right angles is preferentially oriented in a direction rotating in a range of <110> to <111> around the crystal growth direction as an axis, and the normal direction to the film plane is preferentially oriented in a direction rotating in a range of {100} to {112} around the crystal growth direction as an axis. This is because the film goes through the crystallization course by the PMELA process.

There will be described the crystal growth in directions such as the normal direction to the film plane, the crystal growth direction, and the width direction. Crystal nuclei having growth potential are densely generated in an interface between the amorphous silicon layer 3 and the $SiO_2$ layer 2 of the substrate and on a line on which light intensity is minimized as described above. The normal direction to the film plane of the amorphous silicon layer 3 is easily oriented in {100} in which energy of the interface between the amorphous silicon layer 3 and the $SiO_2$ layer 2 is minimum, owing to an increase of an influence of the energy of the interface between the amorphous silicon layer 3 and the $SiO_2$ layer 2 accompanying a thickness decrease and a restriction on the crystal growth of the thickness direction of the amorphous silicon layer 3 whose thickness is smaller than 50 nm.

As to the width direction, the crystal nuclei densely generated adjacent to one another and having growing potential simultaneously grow in a lateral direction. The crystals grow in the width direction, but the growth is restricted by the adjacently growing crystals, and a compressive stress is generated. Therefore, the width direction is easily oriented in {111} which is the densest face. The lateral crystal growth direction is a direction of temperature gradient of a very rapidly quenching and solidifying system, and the crystals are easily oriented in {100} and {110} which are growth ends having a high speed.

Here, considering from the geometric conditions, the crystals are not simultaneously oriented in {100} of the normal direction and {111} of the width direction. They do not cross each other at right angles. Similarly, the lateral direction of growth cannot be <100>. Examples of a crystal orientation to be taken in a case where an effect of the interface energy is large include a crystal orientation in which the orientation of the normal direction is {100}, the orientation of the direction of growth is <110>, and the orientation of the width direction is <110>. Examples of a crystal orientation to be taken in a case where an effect of the compressive stress in the width direction is large include a crystal orientation in which the orientation of the normal direction is {112}, the orientation of the crystal growth direction is <110>, and the orientation of the width direction is <111>.

Next, there will be described a apparatus (crystallization apparatus) for forming the crystal grain array 5 with reference to FIG. 9. FIG. 9 shows an example of a device which forms the crystal grain array 5 in which the elongated crystal grains 4 shown in FIG. 2 are arranged in the width direction by use of the PMELA process. In this example, the device is a laser annealing device in which laser light is used as the energy line.

A laser annealing apparatus 40 includes a projection type optical system 33. In this optical system 33, an XeCl excimer laser oscillator 21, a homogenizer 22, a first condenser lens 23, a second condenser lens 26, a mask 27, a phase shifter 36, and a telecentric reduction lens 28 are arranged in this order along a laser light axis 24. An XYZθ stage 29 for positioning a substrate 32 to be processed is disposed in an image forming position of the telecentric reduction lens 28. The XYZθ stage 29 contains a heater 30 so that the substrate 32 to be processed can be heated if necessary during crystallization. The laser annealing apparatus 40 is constituted in this manner.

The phase shifter 36 is disposed between the mask 27 and the reduction lens 28. The phase shifter 36 modulates a phase of incident laser light, and generates, in a section of the laser light, an inverse-peak-patterned light intensity distribution having a minimum light intensity in an intermediate position as shown in FIG. 10D. The phase shifter 36 is an optical device including a translucent substrate provided with stepped portions, and the incident light is diffracted by this stepped portion to modulate the phase.

The phase shifter 36 is a mask in which the surface of a quartz substrate 51 is etched to thereby form a repeated pattern constituted of stepped dot portions (grooves 52) having periodically different dimensions (areas) as schematically shown in, FIGS. 10A and 10B. The stepped dot portions are formed by the grooves 52 formed by the etching. In this example of the phase shifter 36, as shown in FIG. 10A, there are arranged the stepped dot portions whose dimensions (areas) are periodically different at an interval of 16 μm in terms of a converted value on the substrate. The stepped portion is worked into a dimension of, for example, 154 nm so as to obtain a phase difference of 90°.

FIG. 10A is a plan view of the phase shifter 36. To show a modulated area state, one unit of the shifter is shown in an enlarged size. FIG. 10B is a sectional view of FIG. 10A. FIG. 10C is a sectional view of the substrate 32 to be processed. FIG. 10D is a waveform diagram showing the light intensity distribution in the section of the laser light whose light intensity has been modulated by the phase shifter 36 of FIG. 10A. The waveform diagram is associated with FIG. 10A. The lens 28 (FIG. 9) is an optical system for projecting an image formed by the phase shifter 36 on the surface of the substrate 32 to be processed.

The XYZθ stage 29 is constituted so that the position of the stage can be adjusted in each of X, Y, and Z axial directions and rotatably around the Z-axis. The XYZθ stage 29 can automatically move the substrate 32 to be processed to the next irradiation position in a stepwise manner by a program stored beforehand every time pulse laser light is emitted.

Next, there will be described an example of a crystallization process using this laser annealing apparatus 40 with reference to FIG. 9. A substrate insulating film 2, an amorphous semiconductor layer (e.g., amorphous silicon layer 3 having a thickness of 50 nm or less, e.g., 30 nm), and a photoabsorptive cap film 37 are laminated in this order on a substrate 1 (e.g., glass substrate) of the substrate 32 to be processed laid on the XYZθ stage 29.

The photoabsorptive cap film 37 is, for example, an SiOx film, and "x" is a value below 2. The value "x" is in a range of preferably 1.4 to 1.9, more preferably 1.4 to 1.8. The SiOx film is a silicon oxide film having a different composition ratio of Si and O.

The substrate 1 for the display is a translucent insulating substrate such as a glass substrate or a plastic substrate. The substrate insulating film 2 has a function of preventing impurities from being diffused from the substrate 1, and a function of protecting the substrate 1 from heat in a crystallization process. The amorphous silicon layer 3 is transformed into an array constituted of large crystal grains by thermal processing to form a functional element such as a thin film transistor.

The photoabsorptive cap film 37 is an insulating layer having an insulation effect for growing large crystal grains. The photoabsorptive cap film 37 absorbs the laser light to generate heat, and stores heat obtained by absorbing the laser light by the amorphous silicon layer 3. In this example, the photoabsorptive cap film 37 is required for increasing the length of the amorphous silicon layer 3 during the crystallization of the amorphous silicon layer having a thickness of 50 nm or less. The substrate 32 to be processed is formed in this manner.

Next, the substrate 32 to be processed is disposed in a predetermined position on the XYZθ stage 29. The XeCl excimer laser oscillator 21 (FIG. 9) emits pulse laser light having energy sufficient for melting an irradiated area of the amorphous silicon layer 3 of the substrate 32 to be processed. The laser light has energy of, for example, 300 to 700 mJ/cm$^2$ on the substrate 32 to be processed. A pulse continuing time per shot is, for example, 30 nanoseconds. After laser light 25 as an elongated beam having a wavelength of 308 nm is emitted from the XeCl excimer laser oscillator 21, the light is first divided into diverging beams by the homogenizer 22 constituted of two sets (for X- and Y-directions, respectively) of small lens pairs. The homogenizer 22 is used for homogenizing the light intensity in the section of the laser light from the laser oscillator 21.

The first condenser lens 23 converges laser light of each central beam of the beams divided from the homogenizer 22. The first condenser lens 23 is disposed in a conjugate relation with the second condenser lens 26. The mask 27 is disposed in an emitted light path of the second condenser lens 26. This mask 27 intercepts non-effective laser light. That is, each central beam of the divided beams is converged onto the center of the mask 27 by the condenser lens 23 (convex lens #1). Since each laser beam is slightly of a diverging type, the whole surface of the mask 27 is illuminated.

All points on the mask 27 are irradiated with a group of all beams emitted from divided micro emission areas. Therefore, even if there is an in-plane fluctuation in the light intensity on a laser emission face, the light intensity of the mask 27 becomes uniform. The central beams of a group of beams passed through each area of the mask 27, that is, a group of diverging beams passed through the lens pairs in the center of the homogenizer 22 are converted into parallel beams by the second condenser lens 26 (convex lens #2) in the vicinity of the mask 27. The laser light as the parallel beams passes through the telecentric reduction lens 28 via the phase shifter 36, and perpendicularly enters the substrate 1 laid on the XYZθ stage 29.

The phase shifter 36 modulates the phase of the incident laser light 25, and emits transmission light having the inversely-peak-patterned light intensity distribution. The reduction lens 28 is a lens for reduction to 1/1 to 1/20, for example, 1/5, and is disposed in a conjugate relation with the surface of the substrate 32 to be processed. The reduction lens 28 forms an image of the transmission light having the inversely-peak-patterned light intensity distribution on the surface of the photoabsorptive cap film 37 of the substrate 32 to be processed.

The photoabsorptive cap film 37 absorbs a part of the incident laser light, and most of the remaining light is absorbed by the amorphous silicon layer 3. As a result, a light receiving area of the amorphous silicon layer 3 absorbs the laser light having the light intensity distribution shown in FIG. 10D, and the area is molten. This molten layer heats the cap film 37 on the amorphous silicon layer 3.

After completion of the irradiation with the pulse laser light, the temperature of the molten area starts to drop. At this time, since the photoabsorptive cap film 37 is brought to a high-temperature state, the temperature of the molten area slowly drops. A minimum intensity portion B of the amorphous silicon layer 3 gradually passes through a solidifying point in the inversely-peak-patterned light intensity distribution shown in FIG. 10D. With the movement of this solidifying point in the lateral direction, the crystals are grown.

The minimum portion B first passing through the solidifying point is the crystallization start point 11. The light intensity between the minimum intensity portion B and a maximum intensity portion U determines the length of the crystal grain 4. In a case where the light intensity of the maximum intensity portion U is 1 in the inversely-peak-patterned light intensity distribution, when the light intensity of the minimum intensity portion B is selected in a range of 0.5 to 0.8, it is possible to obtain a crystal grain array having an optimum length. When the minimum intensity portion B has a light intensity of 0.5 or less, a non-crystallized area where the crystals do not grow in the lateral direction, or a micro crystal area is formed in the irradiated area. When the minimum intensity portion B has a light intensity of 0.8 or more, an ascending gradient of the light intensity is moderated, and long crystals cannot be formed.

Such crystallization process is performed by moving the XYZθ stage 29 step by step every predetermined distance in accordance with an emission timing of the pulse laser light from the laser oscillator 21 to shift the irradiated area. This annealing process is repeated with a predetermined procedure to thereby crystallize the amorphous silicon layer 3 on the substrate 1 one after another. According to such crystallization process, it is possible to crystallize the amorphous silicon layer 3 on the substrate 1 for an LCD having a large area whose side is above, for example, 1 m. To shift the irradiated area, the laser light and the stage 29 may be relatively moved.

It has been found that the crystal orientation can be controlled in a case where the amorphous silicon layer 3 whose thickness is below 50 nm is crystallized using the above process.

Moreover, the group of light beams passed through the same place of the mask 27 are focused on one point of the substrate surface. That is, a reduced image of the mask 27 is formed on the substrate surface with a uniform light intensity. The group of light beams with which an arbitrary point of the substrate surface is to be irradiated are constituted of the divided beams including the central beams. An angle formed between a certain light beam and the central beam is an angle determined by a geometric shape of the homogenizer 22, that is, a value obtained by multiplying the angle formed between the light beam and the central beam in the mask by a magnification of the telecentric lens 28.

During laser annealing by a projection process, a value obtained by multiplying a period of the pattern of the phase shifter 36 by the magnification of the reduction lens 28 is preferably in a range of 8 to 30 μm. When the value is excessively large, the growth of the crystal grains in the lateral direction stops halfway, and the whole surface of the irradiated area cannot be covered with the crystal grains. If the value is excessively small, the length of the grown grain in the lateral direction shortens, and this does not contribute to enlargement of particle diameter.

In the projection process, it is comparatively easy to move the substrate step by step by the XYZθ stage 29, and this process is effective as a process for mass production. A structure of an annealed film during the laser annealing needs to be a structure in which a photoabsorptive SiOx film is formed in an upper layer, and an insulating film is formed in a lower layer. Accordingly, when the amorphous silicon layer 3 absorbs the laser light and is molten, heat is held in the amorphous silicon layer 3, and the temperature of the substrate 1 does not rapidly rise owing to thermal diffusion from the amorphous silicon layer 3.

Next, there will be described an example of a process to crystallize the amorphous silicon layer 3 of the substrate 32 to be processed by use of the laser annealing apparatus 40 (crystallization apparatus 40) of FIG. 9.

Embodiment 1

As conditions of crystallization, a substrate 32 to be processed shown in FIG. 10C was constituted in the following laminate structure. An uppermost-layer cap film 37 on an incident light side is a laminate film of SiOx (thickness of 320 nm)/$SiO_2$ (thickness of 30 nm). A non-single-crystal semiconductor film is an amorphous silicon layer 3 (a-Si layer). A substrate insulating film is an $SiO_2$ film (thickness of 1000 nm) 2. The substrate 1 is a glass substrate. The thickness of the amorphous silicon layer 3 was changed into four levels of 30, 40, 50, and 100 nm, and the substrate 32 to be processed was prepared.

It is to be noted that the substrate 32 to be processed including the amorphous silicon layer 3 having a thickness of 100 nm was prepared as a reference example. The laminate film of the cap film 37 is constituted of a SiOx film (thickness of 320 nm) having photoabsorptive characteristics and an $SiO_2$ film having transmission characteristics. The SiOx film is a silicon oxide film whose composition of Si and O is different from that of a silicon dioxide film, and a decay coefficient k is 0.02. The SiOx film is a silicon oxide film whose "x" is smaller than 2.0. Ideally, it is possible to change an optical gap from Si (to 1.1 eVv:x=0) to $SiO_2$ (to 9 eV:x=2). A wavelength of laser for use in crystallization, for example, excimer laser can be controlled so that an absorption coefficient is changed in a range of 0 to $10^5$ $cm^{-1}$. Especially in a case where "x" was in a range of $1.4 \leq x \leq 1.9$, satisfactory crystal growth was confirmed. A photoabsorption coefficient α of the SiOx film is about 7000 cm$^{-1}$.

A laser annealing apparatus 40 of FIG. 9 has an optical system for forming an image of a phase shifter 36 disposed in the vicinity of a mask 27 on an incidence face of a substrate 32 to be processed. That is, the laser annealing apparatus 40 is an optical system to project the phase shifter 36 on the surface of the substrate 32 to be processed, and they have a conjugate relation. It is to be noted that a pattern of the phase shifter 36 is reduced to ⅕ on the substrate 32 to be processed by a telecentric reduction lens 28 of an image forming optical system, having a magnification of ⅕-fold.

As shown in FIG. 10A, dot-patterned stepped portions (high step 52, low step 51) having different areas are disposed in the surface of the phase shifter 36. The substrate 32 to be processed is irradiated with laser light 25 via the phase shifter 36 having the pattern shown in FIG. 10A. A phase of the laser light 25 is modulated by the phase shifter 36, and a light intensity distribution is formed in which inverse peak patterns (V-shape) are repeated as shown in FIG. 10D. In FIG. 10D, one inverse peak pattern is enlarged and shown.

The phase shifter 36 is formed so that a period of the V-shaped light intensity distribution is 16 μm. A phase difference of the phase shifter 36 is, for example, 90°. The phase shifter 36 refers to a space intensity modulation optical element for modulating a phase of laser light. Fluences of laser light emitted for crystallizing the amorphous silicon layer (a-Si layer) 3 are 500, 500, 500, and 600 mJ/cm$^2$ in accordance with irradiation energy of the laser light in a case where thicknesses of the amorphous silicon layer (a-Si layer) 3 are 30, 40, 50, and 100 nm, respectively.

A laser light source 21 is XeCl excimer laser having a wavelength of, for example, 308 nm, and a pulse continuation time per shot is 30 nanoseconds. The fluence is a measure indicating an energy density of the laser light for the crystallization. The fluence means an energy amount of a shot of pulse per unit area, and specifically refers to an average light intensity of laser light measured in a light source or an irradiated area (radiation field).

A crystal orientation of crystal grains crystallized in this manner is shown in FIGS. 6 to 8. FIG. 6 shows a crystal orientation which is a normal direction to a film plane of the crystal grain at a time when the amorphous silicon layers (a-Si layers) 3 having thicknesses of 30, 40, 50, and 100 nm, respectively, are irradiated with the laser light and crystallized. It is shown that the crystal orientation which is the normal direction is intensely oriented in the vicinity of a {100} face at a time when the thickness of the film is 30 nm (black portion).

It is shown that the crystal direction is intensely oriented in the vicinity of a {111} face at a time when the thickness is 40 nm (black portion). It is shown that the crystal direction is weakly oriented in the {100} face and in the vicinity of the {100} face at a time when the thickness is 50 nm (hatched portion). It is shown that the crystal direction is weakly oriented between the {100} face and a {110} face and between the {100} face and the {110} face at a time when the thickness is 100 nm (hatched portion).

FIG. 7 shows a crystal orientation of a crystal growth direction at a time when the amorphous silicon layers (a-Si layers) 3 having thicknesses of 30, 40, 50, and 100 nm, respectively, are irradiated with the laser light and crystallized. It is shown that the crystal growth direction is intensely oriented in the vicinity of the {110} face at a time when the thickness of the film is 30 nm (black portion). It is shown that the crystal growth direction is similarly intensely oriented in the vicinity of the {110} face at a time when the thickness is 40 nm (black portion). It is shown that the crystal growth direction is similarly intensely oriented in the vicinity of the {100} face at a time when the thickness is 50 nm (black portion). It is shown that the crystal growth direction is weakly oriented between the {100} face and the {110} face at a time when the thickness is 100 nm (hatched portion).

FIG. 8 shows a crystal orientation of a width crystal growth direction at a time when the amorphous silicon layers 3 having thicknesses of 30, 40, 50, and 100 nm, respectively, are irradiated with the laser light and crystallized. It is shown that the width direction is intensely oriented in the vicinity of a {111} face at a time when the thickness of the film is 30 nm (black portion).

It is similarly shown that the crystal growth direction is weakly oriented in the vicinity of the {111} face at a time when the thickness is 40 nm (hatched portion). It is shown that the crystal growth direction is similarly weakly oriented in the {111} face and in the vicinity of the {110} face at a time when the thickness is 50 nm (hatched portion). It is shown that the crystal growth direction is weakly oriented in the vicinity of the {111} face at a time when the thickness is 100 nm (hatched portion).

Figure 11:
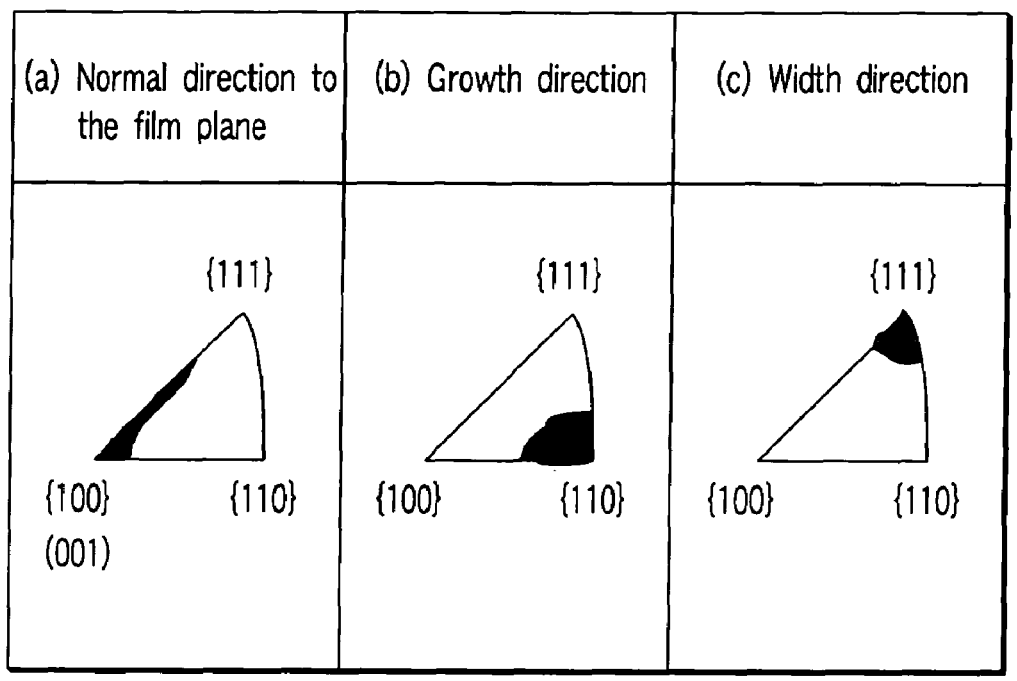
FIG. 11 is a diagram showing crystal orientations in a normal direction to a film plane, a crystal growth direction, and a width direction at a time when an amorphous silicon layer having a thickness of 30 nm is crystallized.

FIG. 11 shows a list of the crystal orientations of the normal direction to the film plane of the crystal grain, the crystal growth direction, and the width direction at a time when the amorphous silicon layer (a-Si layer) 3 having a thickness of 30 nm is irradiated with the laser light and crystallized in FIGS. 6 to 8.

It is seen from these results that the normal direction to the film plane is preferentially oriented in an orientation rotating in a range of {100} to {112} around the crystal growth direction as an axis. The crystal growth direction is preferentially oriented in <110>. The width direction crossing the crystal growth direction at right angles is preferentially oriented in the orientation rotating in a range of <110> to <111> around the crystal growth direction as an axis. As described above, the thickness of the amorphous silicon layer 3 can be changed to thereby control the crystal orientation.

Embodiment 2

A crystallization apparatus is a projection type optical system of FIG. 9 in the same manner as in Embodiment 1. A period of a pattern of a phase shifter 36 is, for example, 16 μm in terms of a converted value on a substrate, and a stepped portion device t is, for example, 154 nm. A phase difference is, for example, 90°. In a periodic V-shaped light intensity distribution formed at this time, a maximum value of an intensity is a relative value of 1, and a minimum value is a relative value of 0.5.

As conditions of crystallization, a substrate 32 to be processed has the following film structure in the same manner as in Embodiment 1. A cap film 37 has a laminate structure of SiOx (thickness of 320 nm)/SiO$_2$ (thickness of 30 nm). An amorphous silicon layer is an a-Si layer (30 nm). A substrate insulating film is an SiO$_2$ film (1000 nm). The substrate 1 is a glass substrate. An irradiation fluence of laser light is, for example, 500 mJ/cm$^2$. A laser light source 21 of this laser light is XeCl excimer laser having a wavelength of, for example, 308 nm, and a pulse continuation time per shot is 30 nanoseconds in the same manner as in Embodiment 1.

Figure 12:
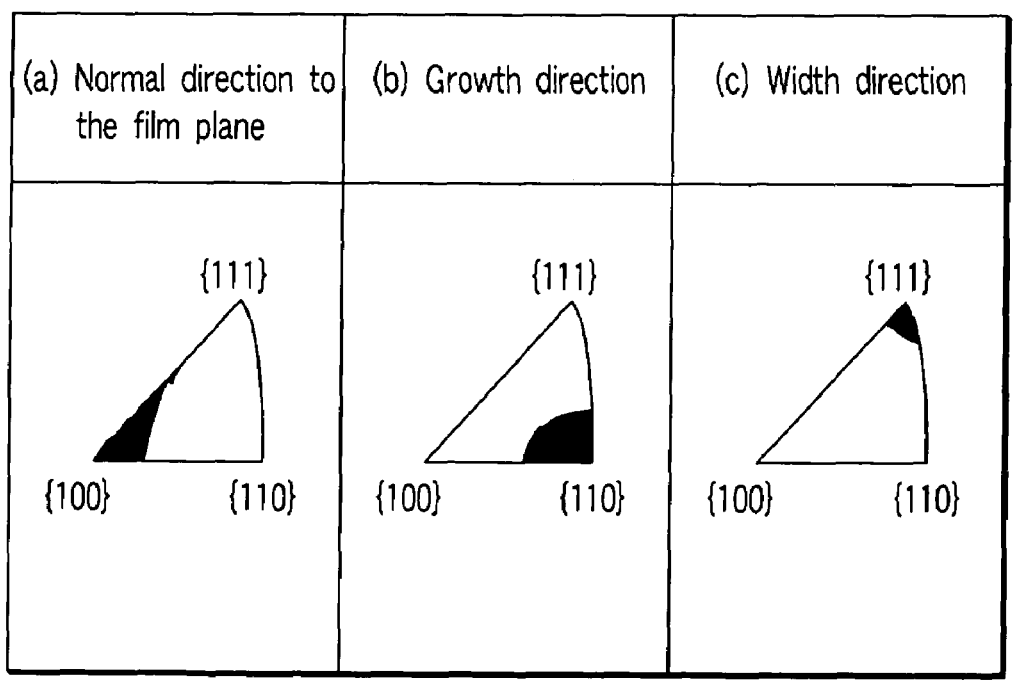
FIG. 12 is a diagram showing another examples of the crystal orientations in the normal direction to the film plane, the crystal growth direction, and the width direction at the time when then amorphous silicon layer having a thickness of 30 nm is crystallized.

FIG. 12 shows a list of crystal orientations of a normal direction to a film plane of a crystal grain, a crystal growth direction, and a width direction at a time when the film is crystallized on the above conditions. FIG. 12 is a reverse polarity point chart showing orientation characteristics of a structure obtained by a crystallization process of this embodiment.

A crystal grain array obtained by this crystallization process is an array constituted of elongated band-shaped crystal grains shown in FIG. 2, and the crystal grains have a length of 8 μm and an average width of 0.2 μm. A longitudinal direction, that is, the crystal growth direction is preferentially oriented in a <110>. The width direction crossing the crystal growth direction at right angles is preferentially oriented in the orientation rotating in a range of <110> to <111> around the crystal growth direction as an axis. The normal direction to the film plane is preferentially oriented in an orientation rotating in a range of {100} to {112} around the crystal growth direction as an axis.

Embodiment 3

In the present embodiment, a projection type optical system of FIG. 9 was used, and a phase shifter 36 constituted of dot patterns having periodically different dimensions as shown in FIG. 10A was used in the same manner as in Embodiment 1. A period of the pattern of the phase shifter 36 is, for example, 16 μm in terms of a converted value on a substrate, and a stepped portion device t is 103 nm. A phase difference of the phase shifter 36 is, for example, 60°. In a periodic V-shaped light intensity distribution formed at this time, a maximum value of an intensity is a relative value of 1, and a minimum value is a relative value of 0.66.

As conditions of crystallization, a substrate 32 to be processed has the following film structure. A cap film 37 has a laminate structure of a photoabsorptive film of SiOx (320 nm) and a light-transmitting and heat-accumulating film of $SiO_2$ (30 nm). An amorphous silicon layer 3 is an a-Si layer (30 nm). A substrate insulating film is an $SiO_2$ film (1000 nm). The substrate 1 is a glass substrate. An irradiation fluence of emitted laser light is, for example, 500 mJ/cm$^2$. A laser light source 21 is XeCl excimer laser having a wavelength of, for example, 308 nm, and a pulse continuation time per shot is 30 nanoseconds in the same manner as in Embodiment 2.

FIG. 12 is a reverse polarity point chart showing orientation characteristics of a structure obtained by a crystallization process of this embodiment. A crystal grain array obtained by this crystallization process is an array constituted of elongated band-shaped crystal grains shown in FIG. 6, and the crystal grains have a length of 8 μm and an average width of 0.2 μm.

Embodiment 4

Next, there will be described an example of a process to form a TFT in a crystallization area formed as described above with reference to FIG. 13. It is to be noted that there will be described herein an example in which an N-channel type TFT is formed, but this process is not limited to the N-channel type TFT only. A P-channel type TFT can be formed in a substantially similar process except that a kind of impurities (kind of dopant) is simply changed. Here, a method of manufacturing a TFT having a bottom gate structure will be described.

Figures 13A, 13B, 13C, 13D:
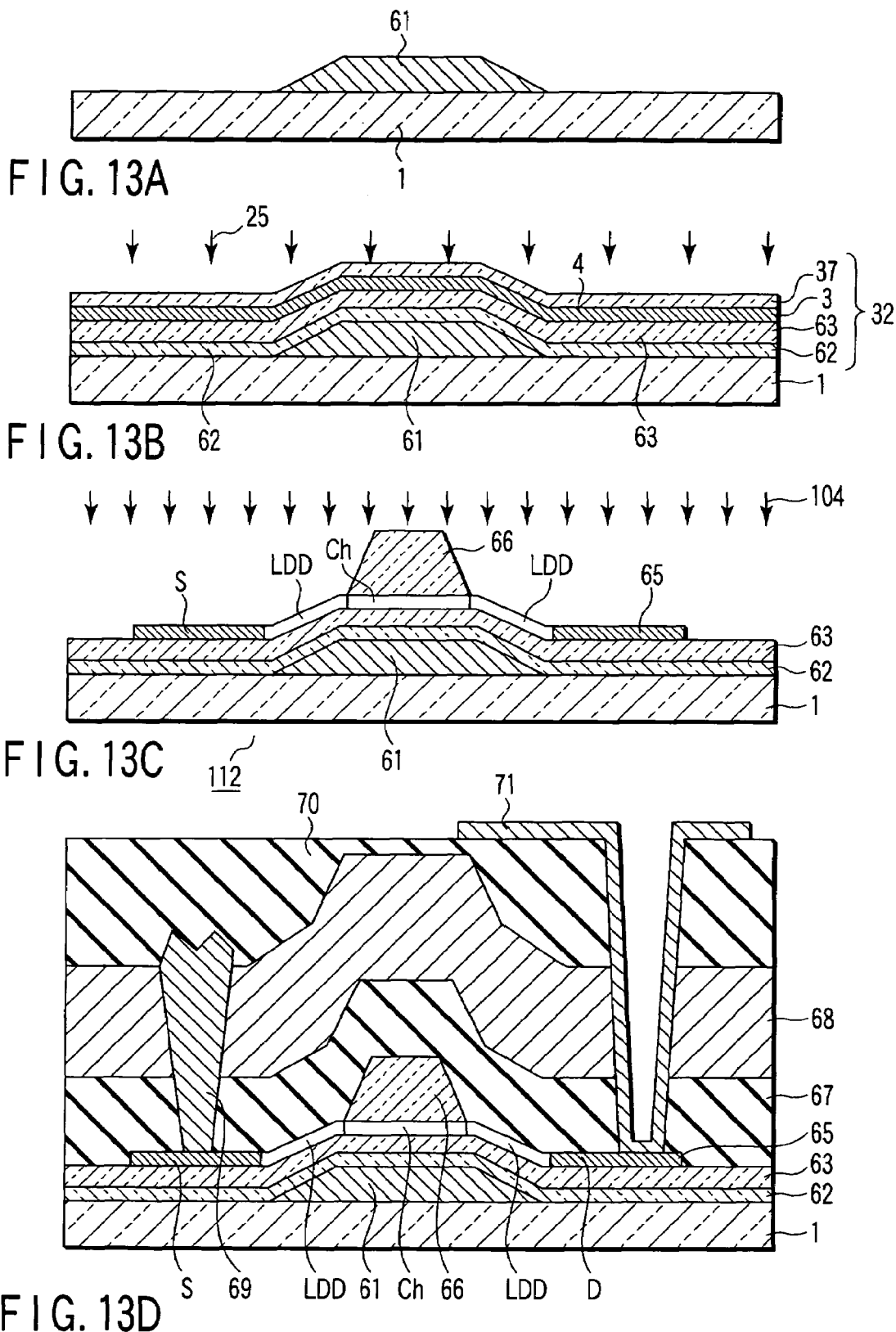
FIGS. 13A to 13D are sectional views showing a series of steps of a bottom-gate-type TFT manufacturing process to which a method of the present invention is applied.

As shown in FIG. 13A, a film of at least one of Al, Ta, Mo, W, Cr, and Cu as a material for a gate electrode, or an alloy film is formed into a thickness of 100 to 300 nm on a substrate 1, for example, an insulating substrate made of glass. This metal film is patterned, and worked into a bottom type gate electrode 61.

Subsequently, as shown in FIG. 13B, gate insulating films 62, 63 are deposited on the gate electrode 61 and an exposed insulating substrate. The gate insulating films 62, 63 have a double-layer structure of, for example, a nitride film (SiNx) and an oxide film ($SiO_2$). The gate nitride film of the gate insulating film 62 can be deposited using, for example, a mixture of an $SiH_4$ gas and an $NH_3$ gas as a material gas by a plasma CVD process (PE-CVD process). It is to be noted that this gate nitride film may be deposited using normal-pressure CVD or reduced-pressure CVD instead of the plasma CVD.

The nitride film has a thickness of, for example, 50 nm. An oxide film as the gate insulating film 63 is deposited in a thickness of, for example, about 200 nm on the nitride film. A non-single-crystal film, for example, an amorphous silicon layer 3 is continuously deposited to be thin in a thickness of 50 nm or less, for example, 30 nm on this oxide film. Furthermore, a cap film 37 made of, for example, $SiO_2$/SiOx is deposited in this order into thicknesses of, for example, 30 and 320 nm, respectively, on the amorphous silicon layer 3. The gate insulating films 62, 63, the amorphous silicon layer 3, and the cap film 37 having the double-layer structure are continuously deposited without breaking a vacuum system of a deposition chamber (i.e., without being exposed to the atmosphere).

In a case where the above deposition process is performed using the plasma CVD process, when heating is performed at a temperature of 550° C. in a nitrogen atmosphere for about two hours, hydrogen included in the amorphous silicon layer 3 is discharged from the amorphous silicon layer 3. A substrate 32 to be crystallized is manufactured in this manner.

Next, there is performed a crystallization process of the thin amorphous silicon layer 3 having a thickness of 50 nm in the substrate 32 to be crystallized. The crystallization process can be performed using, for example, a laser annealing apparatus 40 of FIG. 9. For example, the cap film 37 is irradiated with laser light 25, and an irradiated area of the amorphous silicon layer 3 is crystallized by the method described in, for example, the above first to third embodiments.

As the laser light 25, an excimer light beam can be used. After adjusting and focusing an area to be irradiated with the laser light 25, the area is irradiated with the laser light 25, and a periodic pattern of a phase shifter 36 is transferred to the irradiated area. Furthermore, while the irradiated area is displaced so that the area does not overlap with another area, a shot of irradiation with the laser light 25 is repeated, and a predetermined area of the irradiated area is crystallized. In this manner, the predetermined area of the amorphous silicon layer 3 is crystallized, and a polycrystalline semiconductor thin film 65 is formed.

Next, the cap insulating film 37 on the surface is peeled by a method such as etching, and the surface of the amorphous silicon layer 3 in which the crystallized area has been formed is exposed. In this manner, as to the surface of the area crystallized from the thin amorphous silicon layer 3 having a thickness of 50 nm or less, as shown in FIGS. 6 to 8, a crystal growth direction is preferentially oriented in <110> to form an array of crystal grains longer in the crystal growth direction than in a width direction as shown in FIG. 2.

As shown in FIG. 13C, ion implantation is performed for a purpose of controlling a threshold voltage $V_{th}$ of a TFT into a desired value. In this example, boron B+ was ion-implanted so that a dosage was in a range of about $5 \times 10^{11}$ to $4 \times 10^{12}/cm^2$. In this $V_{th}$ ion implantation, an ion beam accelerated at 10 keV was used.

Subsequently, $SiO_2$ is deposited in a thickness of, for example, about 100 nm to 300 nm on the polycrystalline semiconductor thin film 65 crystallized in the previous process by, for example, the plasma CVD process. In this example, a silane gas $SH_4$ and an oxygen gas were plasma-decomposed to thereby deposit $SiO_2$. Moreover, $SiO_2$ deposited in this manner was patterned into a predetermined shape to form a stopper film 66.

In this case, the stopper film 66 is patterned to be matched with the gate electrode 61 by use of a back face exposure technology. A portion of the polycrystalline semiconductor thin film 65 positioned right under the stopper film 66 is protected as a channel region Ch. As described above, the B+ ions are implanted with a comparatively small dosage by the ion implantation for obtaining a high threshold voltage $V_{th}$ beforehand.

Next, impurities (e.g., P+ ions) are implanted in the semiconductor thin film 65 by ion doping by use of the stopper film 66 as a mask, and an LDD area is formed. At this time, the dosage is, for example, $5 \times 10^{12}$ to $1 \times 10^{13}/cm^2$, and an acceleration voltage is, for example, 10 keV.

Furthermore, a photoresist is patterned to coat the stopper film 66 and the LDD areas on opposite sides of the film. Next, impurities (e.g., P+ ions) are implanted in a high concentration by use of the mask, and a source region S and a drain region D are formed. During the implantation of the impurities, for example, ion doping (ion shower) can be used. In this case, the impurities are implanted by acceleration of an electric field without performing mass separation. In this example, the impurities were injected with a dosage of about $1 \times 10^{15}/cm^2$, and a source region S and a drain region D were formed. An acceleration voltage of ion implantation is, for example, 10 keV.

It is to be noted that although not shown, in a case where the P-channel type TFT is formed, after coating an N-channel type TFT area with the photoresist, the ion doping may be performed with a dosage of about $1 \times 10^{15}/cm^2$ by use of B+ ions instead of P+ ions as impurities. It is to be noted that here the impurities may be implanted using a mass-separation-type ion implantation device.

Thereafter, the impurities implanted into the polycrystalline semiconductor thin film 65 is activated by rapid thermal annealing (RTA) 104. As the case may be, energized laser annealing (ELA) may be performed using excimer laser. Thereafter, unnecessary portions of the semiconductor thin film 65 and the stopper film 66 are simultaneously patterned to separate the TFT every element area.

Finally, as shown in FIG. 13D, $SiO_2$ is deposited into a thickness of about 100 to 200 nm to form an interlayer insulating film 67. After forming the interlayer insulating film 67, SiNx is deposited into a thickness of about 200 to 400 nm by the plasma CVD process to form a passivation film 68. In this stage, thermal processing is performed in a nitrogen gas or a forming gas or under vacuum at about 350 to 400° C. for one hour to diffuse hydrogen atoms included in the interlayer insulating film 67 into the semiconductor thin film 65.

Thereafter, a contact hole for forming a source S electrode is opened, and an electrode material layer of Mo, Al or the like is deposited into a thickness of 100 to 200 nm by sputtering. Next, the electrode material layer is patterned into a predetermined shape to work a wiring electrode 69. Furthermore, after forming a flattening layer 70 made of an acrylic resin or the like in a thickness of about 1 μm, a contact hole for a drain D electrode is opened. After depositing a transparent conductive film made of ITO or the like on the flattening layer 70 by sputtering, the film is patterned into a predetermined shape to form a pixel electrode 71. A TFT 112 is manufactured in this manner.

Embodiment 5

Figure 14A:
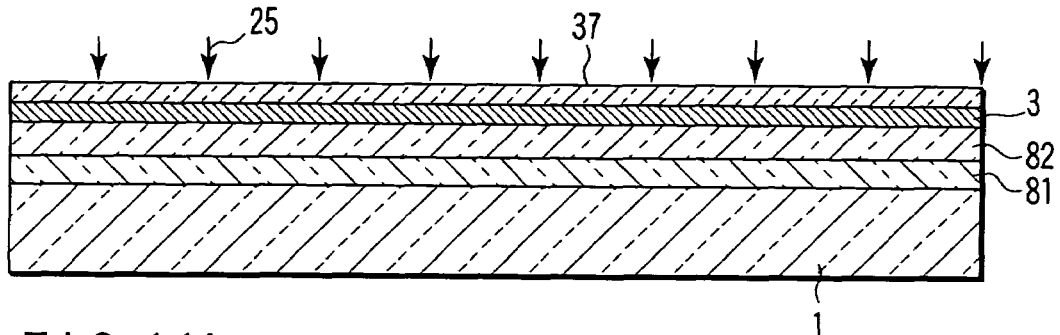
FIGS. 14A to 14C are sectional views showing a series of steps of a top-gate-type TFT manufacturing process to which a method of the present invention is applied.

Next, there will be described a process in a case where a method of the present invention is applied to manufacturing of a TFT having a top gate structure with reference to FIGS. 14 to 14C. First, as shown in FIG. 14A, substrate films 81, 82 as two buffer layers are continuously deposited on an insulating substrate 1 by a plasma CVD process.

The first-layer substrate film 81 is constituted of an SiNx film (X<2), and a thickness of the film is 100 to 500 nm. The second-layer substrate film 82 is constituted of an $SiO_2$ film, and a thickness of the film is similarly 100 to 500 nm. A non-single-crystal semiconductor thin film 4 made of amorphous silicon is deposited in a thickness of 50 nm or less (e.g., 30 nm) on the substrate film 82 constituted of this $SiO_2$ film by the plasma CVD process or an LPCVD process.

Furthermore, a cap film 37 made of $SiO_2$/SiOx is deposited in this order into thicknesses of 30 nm and 320 nm, respectively, on the non-single-crystal semiconductor thin film 3. In a case where the non-single-crystal semiconductor thin film 3 made of amorphous silicon is deposited using the plasma CVD process, annealing is performed in nitrogen atmosphere at a temperature of 400 to 450° C. for about one hour in order to desorb hydrogen in the film.

Next, the thin amorphous semiconductor film 3 is crystallized by, for example, the crystallization method described above in Embodiments 1 to 3. After adjusting an area to be irradiated with laser light 25, the laser light 25 is focused on the area to be irradiated so that a periodic pattern of a phase shifter 36 can be transferred to the irradiated area, and the area is irradiated with the laser light 25. Furthermore, while the irradiated area is displaced so that the area does not overlap with another area, a shot of irradiation with the laser light 25 is repeated, and a predetermined area of the thin amorphous semiconductor film 3 is crystallized.

Subsequently, the cap film 37 is peeled by etching. Here, if necessary, ion implantation is performed in order to a high threshold voltage $V_{th}$ beforehand in the same manner as in the above embodiments. Specifically, B+ ions are implanted into the thin semiconductor film 3 so that a dosage is in a range of about $5 \times 10^{11}$ to $4 \times 10^{12}/cm^2$. In this case, acceleration voltage is about 10 keV.

Figure 14B:
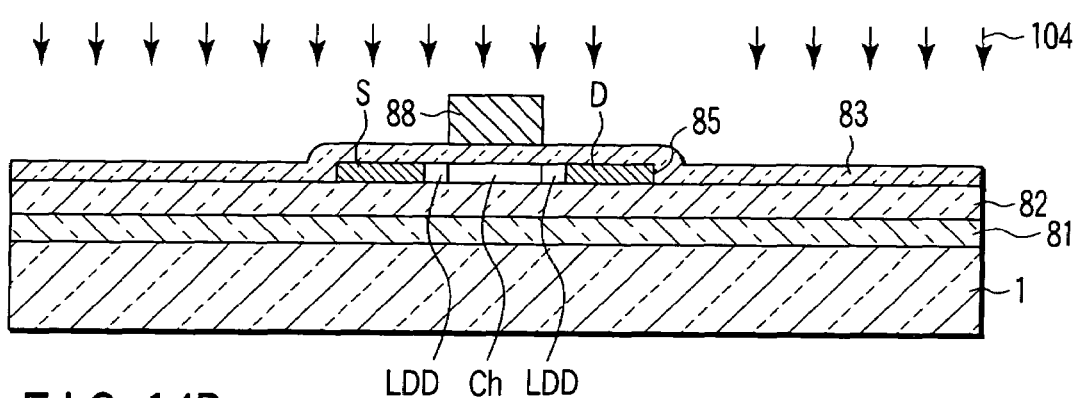

Next, as shown in FIG. 14B, a crystallized silicon semiconductor thin film 85 is patterned into an island shape. On the film, $SiO_2$ is deposited in a thickness of 100 to 400 nm by the plasma CVD process, a normal-pressure CVD process, a reduced-pressure CVD process, an ECR-CVD process, a sputtering process or the like, and a gate insulating film 83 is formed. In this example, the gate insulating film 83 has a thickness of 100 nm.

Subsequently, Al, Ti, Mo, W, Ta, doped polycrystalline silicon, or an alloy of them is deposited into a thickness of 200 to 800 nm on the gate insulating film 83. This film is patterned into a predetermined shape, and a gate electrode 88 is formed.

Next, P+ ions are implanted in the crystallized semiconductor thin film 85 by an ion implantation process using mass separation, and an LDD area is formed. The ions are implanted in the whole surface of the substrate 1 by use of the gate electrode 88 as a mask. A dosage is $6 \times 10^{12}$ to $5\times10^{13}/cm^2$. An acceleration voltage is, for example, 90 keV. It is to be noted that a channel region Ch positioned right under the gate electrode 88 is protected, and B⁺ ions implanted beforehand by the Vth ion implantation are retained as such.

After implanting the ions in the LDD area, a resist pattern is formed to coat the gate electrode 88 and its periphery. The P⁺ ions are implanted in the crystallized semiconductor thin film 85 with a high density by a mass non-separation type ion shower doping process by use of the resist pattern as a mask, and a source region S and a drain region D are formed. In this case, a dosage is, for example, about $1\times10^{15}/cm^2$. An acceleration voltage is, for example, 90 keV. In a doping gas, a 20% $PH_3$ gas diluted with hydrogen is used.

To form a CMOS circuit, after forming a resist pattern for a P-channel TFT, ions are implanted using 5 to 20% of $B_2H_6/H_2$ gas as a doping gas. A dosage is about $1\times10^{15}$ to $3\times10^{15}/cm^2$, and an acceleration voltage is, for example, 90 keV. It is to be noted that the source region S and the drain region D may be formed using a mass separation type ion implantation device.

Next, a dopant injected in the crystallized semiconductor thin film 85 is activated. This activation can be performed using RTA 104 by use of an ultraviolet lamp in the same manner as in Embodiment 4.

Figure 14C:
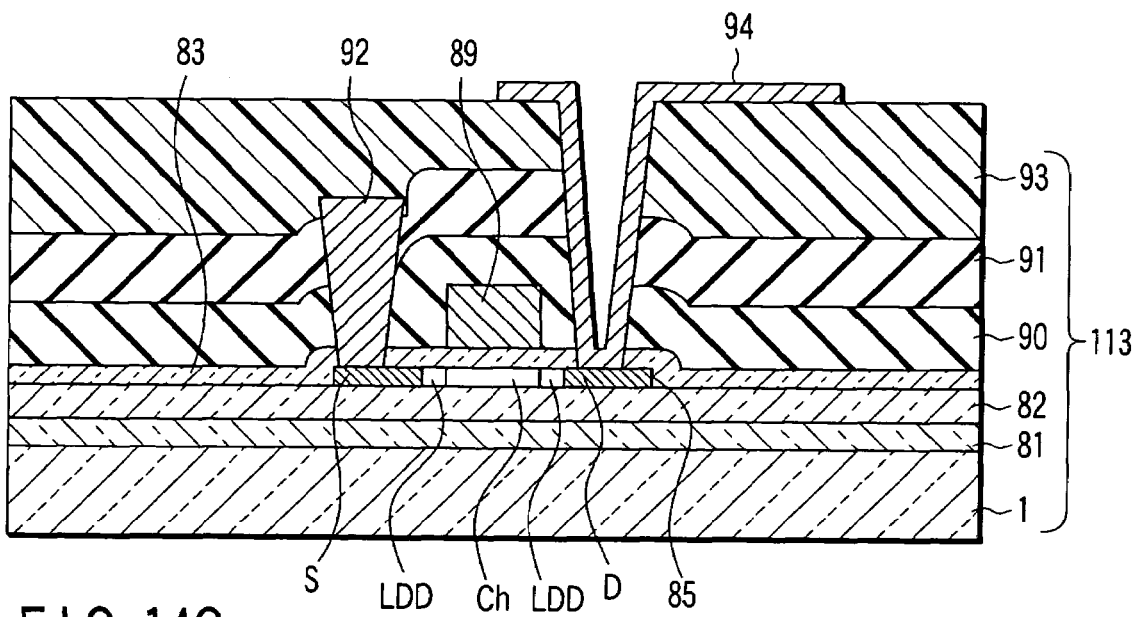

Finally, as shown in FIG. 14C, an interlayer insulating film 90 made of PSG or the like is deposited to coat a gate electrode 89. After depositing the interlayer insulating film 90, SiNx is deposited into a thickness of about 200 to 400 nm by the plasma CVD process to form a passivation film 91.

In this stage, annealing is performed in a nitrogen gas at 350° C. for one hour to diffuse hydrogen contained in the interlayer insulating film 91 into the semiconductor thin film 85. Thereafter, a contact hole is made. Furthermore, after depositing Al—Si on the passivation film 91 by sputtering, this layer is patterned into a predetermined shape to work a wiring electrode 92.

Furthermore, after forming a flattening layer 93 made of an acrylic resin or the like in a thickness of about 1 μm, a contact hole is made in the layer. After depositing a transparent conductive film made of ITO or the like on the flattening layer 93 by sputtering, the film is patterned into a predetermined shape to form a pixel electrode 94.

Even in the TFT shown in FIGS. 14A to 14C, the non-single-crystal semiconductor thin film 3 is crystallized by a method similar to that described with respect to the TFT shown in FIGS. 13A to 13D. However, the TFT having the top gate structure in Embodiment 6 is different from the TFT having the bottom gate structure in Embodiment 5 in that the crystallization is performed before the pattern of the gate electrode 89 is formed. Therefore, as to contraction of an insulating substrate made of glass or the like, an allowance is larger than that of a semiconductor device having the bottom gate structure. Therefore, it is possible to perform crystallization by use of a laser irradiation device having a larger output. A TFT 113 is manufactured in this manner.

Embodiment 6

Next, there will be described an example of an active matrix type display using an TFT of Embodiment 5 or 6 with reference to FIG. 15.

A display panel 100 has a panel structure including a pair of insulating substrates 101, 102, and an electrooptic material 103 held between both of the substrates. A liquid crystal material is broadly used as the electrooptic material 103. A pixel array region 104 and a driving circuit portion are integrated and formed on the underside insulating substrate 101. A driving circuit portion is divided into a vertical driving circuit 105 and a horizontal driving circuit 106.

Moreover, a terminal portion 107 for external connection is formed in an upper end of a peripheral portion of the insulating substrate 101. The terminal portion 107 is connected to the vertical driving circuit 105 and the horizontal driving circuit 106 via a wiring line 108. A row gate wiring line 109 and a column signal wiring line 110 are formed in the pixel array region 104. A pixel electrode 111 or a TFT 112 (or 113) which drives this electrode are formed in an intersecting portion between the wiring lines 109 and 110.

Gate electrodes 61, 89 of the TFT 112 (or 113) are connected to the corresponding gate wiring line 109, a drain region D is connected to the corresponding pixel electrode 111, and a source region S is connected to the corresponding signal wiring line 110. The gate wiring line 109 is connected to the vertical driving circuit 105, and the signal wiring line 110 is connected to the horizontal driving circuit 106.

The TFT 112 (or 113) for switching and driving the pixel electrode 111, and the TFTs included in the vertical driving circuit 105 and the horizontal driving circuit 106 are prepared in the embodiment of the present invention. Therefore, these TFT have a mobility higher than that of a conventional example. Therefore, not only the driving circuit but also a higher-performance processing circuit can be integrated and formed.

Embodiment 7

Crystallization was performed using a laser annealing apparatus 40 shown in FIG. 9 by use of a phase shifter 36 (FIGS. 10A, B) having a dimension different from that of each embodiment described above. The details of the phase shifter 36 are as follows: a pattern period is 16 μm in terms of a converted value on a substrate; a stepped portion depth t is 103 nm; and a phase difference is 60°. In a light intensity distribution (FIG. 10D) of laser light obtained by this phase shifter 36, a maximum value of the intensity is a relative value of 1, and a minimum value is a relative value of 0.66.

A substrate 32 to be processed for use in this embodiment has the following film structure. A cap film has a laminate structure of SiOx (320 nm) and $SiO_2$ (30 nm). An amorphous silicon layer is made of a-Si (40 nm). An underlying insulating film is made of $SiO_2$ (1100 nm). A substrate is a glass substrate. An irradiation fluence of the laser light is 500 mJ/cm². The laser light is XeCl excimer laser having a wavelength of 308 nm, and a pulse continuation time per shot is 30 nanoseconds.

Figure 16:
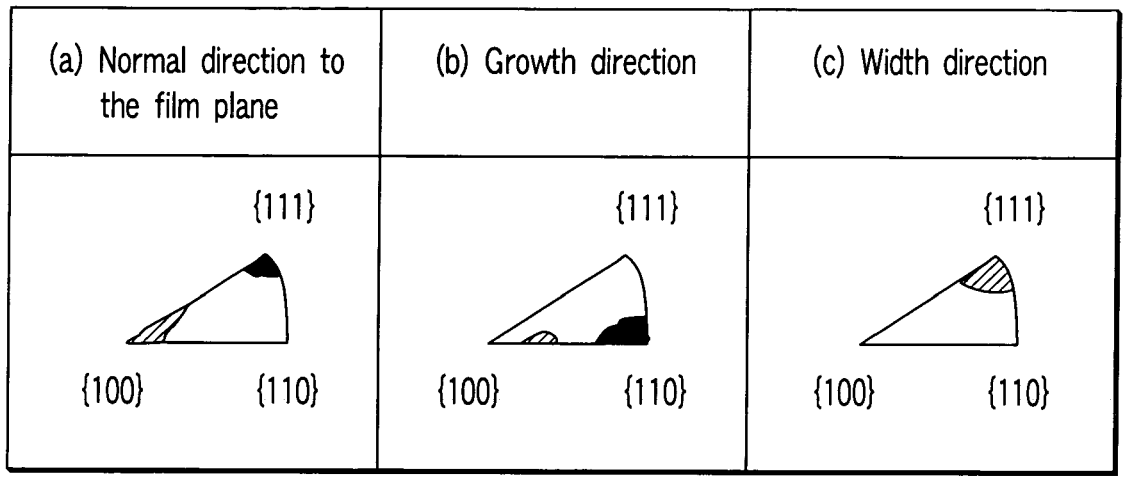
FIG. 16 is a diagram showing crystal orientations in a normal direction to a film plane, a crystal growth direction, and a width direction at a time when an amorphous silicon layer having a thickness of 40 nm is crystallized.

FIG. 16 shows a structure of a-Si (40 nm) crystallized by irradiating the substrate 32 to be processed with laser light. FIG. 16 is a reverse polarity point chart showing orientation characteristics of the crystallized structure. As shown in FIG. 2, the structure is an array of elongated-band-like crystal grains 4 having a length of 8 μm and an average width of 0.4 μm. As seen from FIG. 16, a longitudinal direction, that is, a crystal growth direction is preferentially oriented in <110>, and a fluctuation into another orientation is larger than that in the layer having a thickness of 30 nm.

As shown in FIG. 16 (*a*), a normal direction to a film plane is oriented in {111}, and also weakly oriented around {100}. This is different from a case where the amorphous silicon layer has a thickness of 30 nm. Such orientation is supposedly generated in a case where the orientation in a range of {100} to {112} immediately after completion of the crystallization undergoes twin-crystal deformation around a crystal growth direction <110> as an axis. This is because the average width is larger than that in the layer having a thickness of 30 nm, and twin-crystal deformation is easily generated.

As shown in FIG. 16 (b), the crystal growth direction is intensely and preferentially oriented in <110>. In a case where a TFT is prepared using the crystallized silicon film of the present embodiment, a transistor is disposed so that the crystal growth direction agrees with a direction in which a current flows. In this case, the direction of the current is substantially oriented in <110>, but the crystal orientation of the normal direction to the film plane fluctuates in a range of {001} to {111}. Therefore, a channel width needs to be enlarged to reduce an influence of the fluctuation in the crystal orientation. A structure of the crystallized Si film is inferior as compared with the film having a thickness of 30 nm.

As shown in FIG. 16 (c), the width direction of the crystal grain 4 is weakly and preferentially oriented in <111>.

Embodiment 8

Crystallization was performed using a laser annealing apparatus 40 shown in FIG. 9 by use of a phase shifter 36 (FIGS. 10A, B) having a dimension equal to that of Embodiment 7. Therefore, a light intensity distribution of laser light whose phase has been modulated by the phase shifter 36 is also the same as that of Embodiment 7. That is, assuming that a maximum value U of light intensity is a relative value of 1, a minimum value B is a relative value of 0.66.

A substrate 32 to be processed is different from that of Embodiment 7 in a thickness of an amorphous silicon layer 3 only. That is, the substrate 32 to be processed has the following film structure. A cap film has a laminate structure of SiOx (320 nm) and SiO$_2$ (30 nm). The amorphous silicon layer is made of a-Si (50 nm). An underlying insulating film is made of SiO$_2$ (1100 nm). A substrate is a glass substrate. Laser light has the same conditions as those of Embodiment 7.

Figure 17:
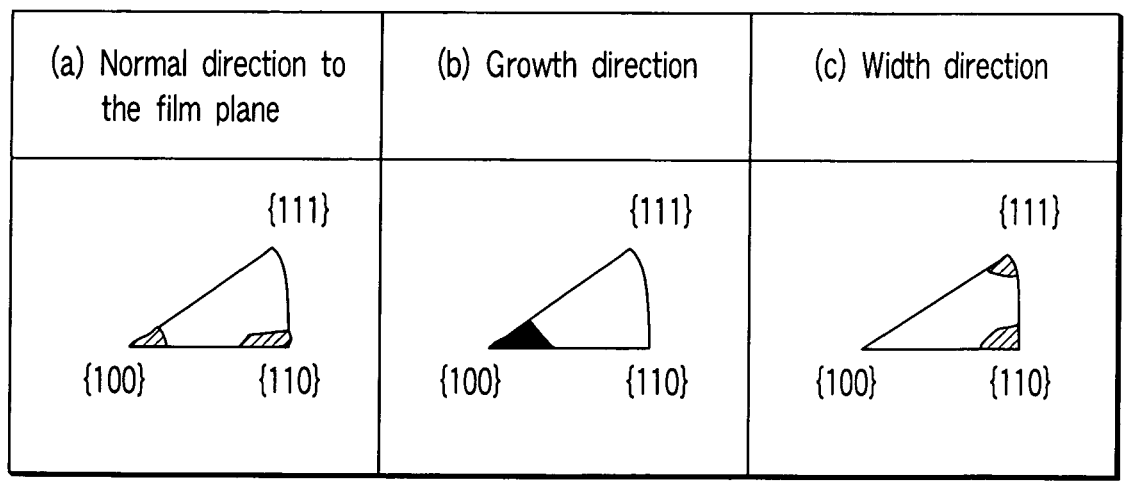
FIG. 17 is a diagram showing crystal orientations in a normal direction to a film plane, a crystal growth direction, and a width direction at a time when an amorphous silicon layer having a thickness of 50 nm is crystallized.

FIG. 17 shows a structure of an crystallized area obtained by crystallizing corresponding substrate 32 to be processed including the amorphous silicon layer 3 having a thickness of 50 nm. FIG. 17 is a reverse polarity point chart showing orientation characteristics of the structure. The structure is an array of elongated crystal grains 4 having a length of 8 μm and an average width of 0.5 μm. A longitudinal direction, that is, a crystal growth direction is preferentially oriented in <100>, and this is largely different from a case where the film has a thickness of 30 or 40 nm. A normal direction to a film plane (FIG. 7(a)) and a width direction crossing a crystal growth direction at right angles (FIG. 17(c)) are weakly oriented, and these directions also fluctuate.

In a case where a TFT is prepared using the crystallized silicon film of the present embodiment, a transistor is disposed so that the crystal growth direction agrees with a direction of a current. In this case, the direction of the current is substantially oriented in <100>, but the crystal direction which is normal to the film plane fluctuates. Therefore, a channel width needs to be enlarged to reduce an influence of the fluctuation in the crystal orientation. A structure of the crystallized Si film is inferior as compared with the film having a thickness of 30 nm.

As described above, according to this embodiment, it is possible to obtain a TFT having a high mobility and fewer fluctuations in mobility or threshold voltage characteristics.

What is claimed is:

1. A thin film transistor comprising:
   a substrate;
   a non-single-crystal semiconductor thin film disposed directly or indirectly on the substrate;
   a crystal grain array formed in the non-single-crystal semiconductor thin film and including crystal grains, the crystal gains exhibiting a shape of a band extending in a same longitudinal direction parallel to a surface of the substrate on which the non-single-crystal semiconductor thin film was disposed and arranged adjacent to each other in a width direction; and
   a source region and a drain region including a plurality of crystal grains of the crystal grain array and formed so that a current flows in the longitudinal direction of the crystal grains,
   wherein the crystal grains are formed by generating crystal species in the non-single-crystal semiconductor thin film, and then growing crystals from the respective crystal species in the longitudinal direction.

2. The thin film transistor according to claim 1, wherein a crystal growth direction of the crystal grains is preferentially oriented in <110>.

3. The thin film transistor according to claim 1, wherein an orientation of a face of a channel region disposed between the source region and the drain region and facing a gate insulating film is in a range of {001} to {112}.

4. The thin film transistor according to claim 1, wherein the crystal grains have a length in a range of 4 to 15 μm, and a width in a range of 0.2 to 0.6 μm.

5. The thin film transistor according to claim 1, wherein the non-single-crystal semiconductor thin film has a thickness of less than 50 nm.

6. The thin film transistor according to claim 1, wherein the width direction crossing the crystal growth direction at right angles is preferentially oriented in a direction rotating in a range of <110> to <111> around the crystal growth direction as an axis.

* * * * *